United States Patent
Toba et al.

(10) Patent No.: US 8,969,943 B2
(45) Date of Patent: Mar. 3, 2015

(54) SEMICONDUCTOR DEVICE AND MANUFACTURING METHOD OF SEMICONDUCTOR DEVICE

(75) Inventors: Koichi Toba, Kanagawa (JP); Yasushi Ishii, Kanagawa (JP); Hiraku Chakihara, Kanagawa (JP); Kota Funayama, Kanagawa (JP); Yoshiyuki Kawashima, Kanagawa (JP); Takashi Hashimoto, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 8 days.

(21) Appl. No.: 13/302,184

(22) Filed: Nov. 22, 2011

(65) Prior Publication Data

US 2012/0132978 A1   May 31, 2012

(30) Foreign Application Priority Data

Nov. 25, 2010   (JP) .................................. 2010-262394

(51) Int. Cl.
  *H01L 29/792*  (2006.01)
  *H01L 21/28*  (2006.01)
  *H01L 27/115*  (2006.01)

(52) U.S. Cl.
  CPC ........ *H01L 29/792* (2013.01); *H01L 21/28282* (2013.01); *H01L 27/11568* (2013.01); *H01L 27/11573* (2013.01)
  USPC .................................. 257/324; 257/E29.309

(58) Field of Classification Search
  USPC .................. 257/315, 316, 324, 325, E29.309, 257/E21.423
  See application file for complete search history.

(56) References Cited

U.S. PATENT DOCUMENTS

| 7,087,955 | B2 | 8/2006 | Kawashima et al. |
| 7,132,718 | B2 | 11/2006 | Hisamoto et al. |
| 7,371,631 | B2 | 5/2008 | Sakai et al. |
| 7,667,259 | B2* | 2/2010 | Yasui et al. .................... 257/314 |
| 8,222,686 | B2* | 7/2012 | Shukuri ........................ 257/316 |
| 8,405,140 | B2 | 3/2013 | Io |
| 8,410,543 | B2 | 4/2013 | Yanagi et al. |

(Continued)

FOREIGN PATENT DOCUMENTS

| JP | 2004-186452 A | 7/2004 |
| JP | 2004-303918 A | 10/2004 |

(Continued)

OTHER PUBLICATIONS

Office Action issued Aug. 5, 2014, in Japanese Patent Application No. 2010-262394.

(Continued)

*Primary Examiner* — Benjamin Sandvik
(74) *Attorney, Agent, or Firm* — Miles & Stockbridge P.C.

(57) ABSTRACT

A semiconductor device with a nonvolatile memory is provided which has improved characteristics. The semiconductor device includes a control gate electrode, a memory gate electrode disposed adjacent to the control gate electrode, a first insulating film, and a second insulating film including therein a charge storing portion. Among these components, the memory gate electrode is formed of a silicon film including a first silicon region positioned over the second insulating film, and a second silicon region positioned above the first silicon region. The second silicon region contains p-type impurities, and the concentration of p-type impurities of the first silicon region is lower than that of the p-type impurities of the second silicon region.

19 Claims, 28 Drawing Sheets

(56) References Cited

U.S. PATENT DOCUMENTS

| | | | |
|---|---|---|---|
| 2002/0047150 A1* | 4/2002 | Tokunaga et al. | 257/297 |
| 2005/0180207 A1* | 8/2005 | Yoshino | 365/185.01 |
| 2008/0121974 A1* | 5/2008 | Steimle et al. | 257/319 |
| 2008/0290401 A1* | 11/2008 | Yasui et al. | 257/324 |
| 2009/0309153 A1 | 12/2009 | Yanagi et al. | |
| 2012/0112256 A1* | 5/2012 | Tan et al. | 257/296 |

FOREIGN PATENT DOCUMENTS

| | | |
|---|---|---|
| JP | 2006-019373 A | 1/2006 |
| JP | 2006-303918 A | 11/2006 |
| JP | 2006-525683 A | 11/2006 |
| JP | 2008-211162 A | 9/2008 |
| JP | 2009-099672 A | 5/2009 |
| JP | 2009-200334 A | 9/2009 |
| JP | 2009-302269 A | 12/2009 |
| WO | WO 2004/100223 A2 | 11/2004 |

OTHER PUBLICATIONS

Office Action (Notification of Reasons for Refusal) dated Apr. 8, 2014, in Japanese Patent Application No. 2010-262394.

* cited by examiner

| OPERATION \ APPLIED VOLTAGE | Vd | Vcg | Vmg | Vs | Vb |
|---|---|---|---|---|---|
| WRITING | 1 V | Vdd | 12 V | 6 V | 0 |
| ERASING | 0 | 0 | −6 V | 6 V | 0 |
| READING | Vdd | Vdd | Vdd | 0 | 0 |

Vdd = 1.5 V

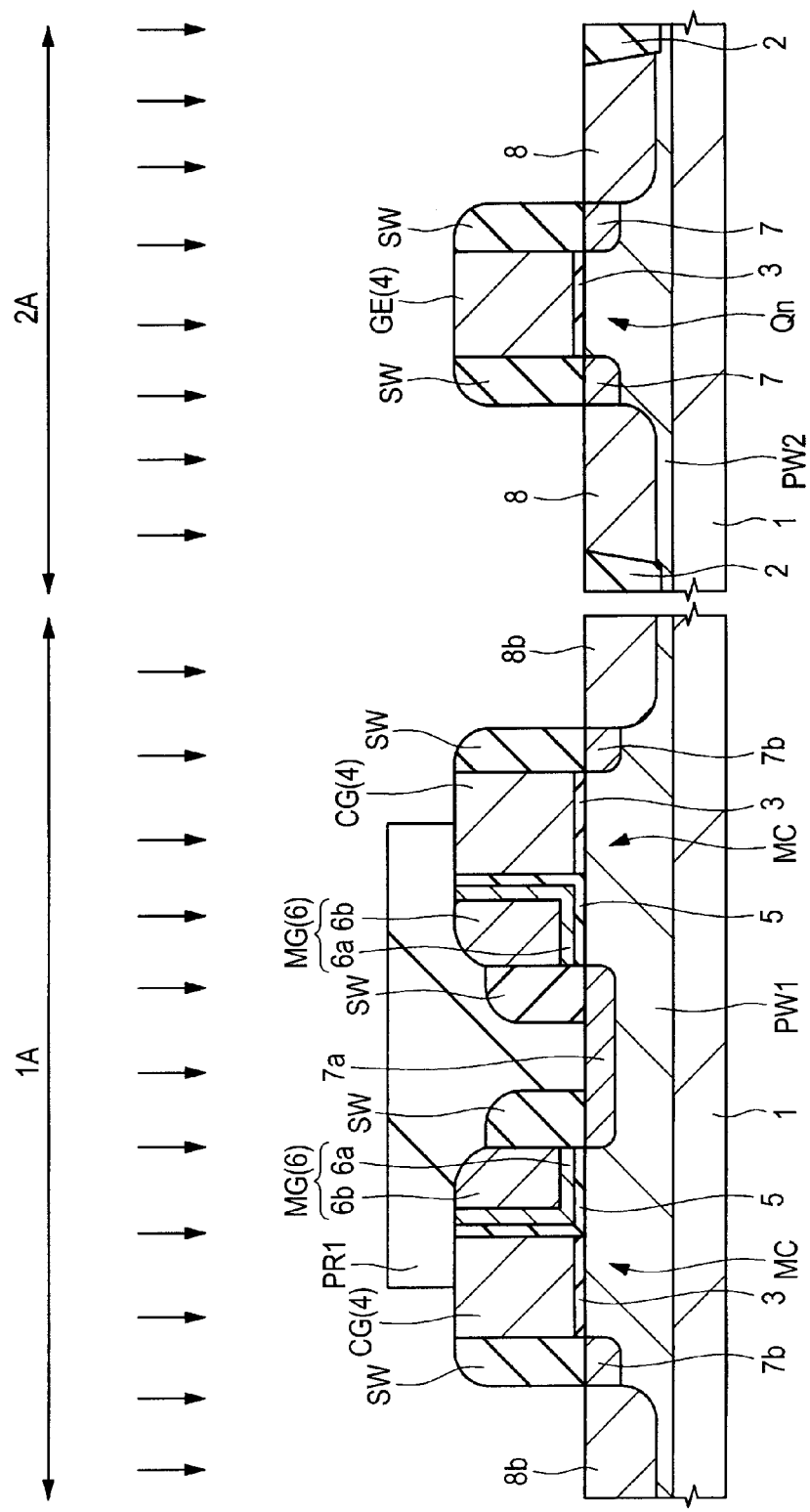

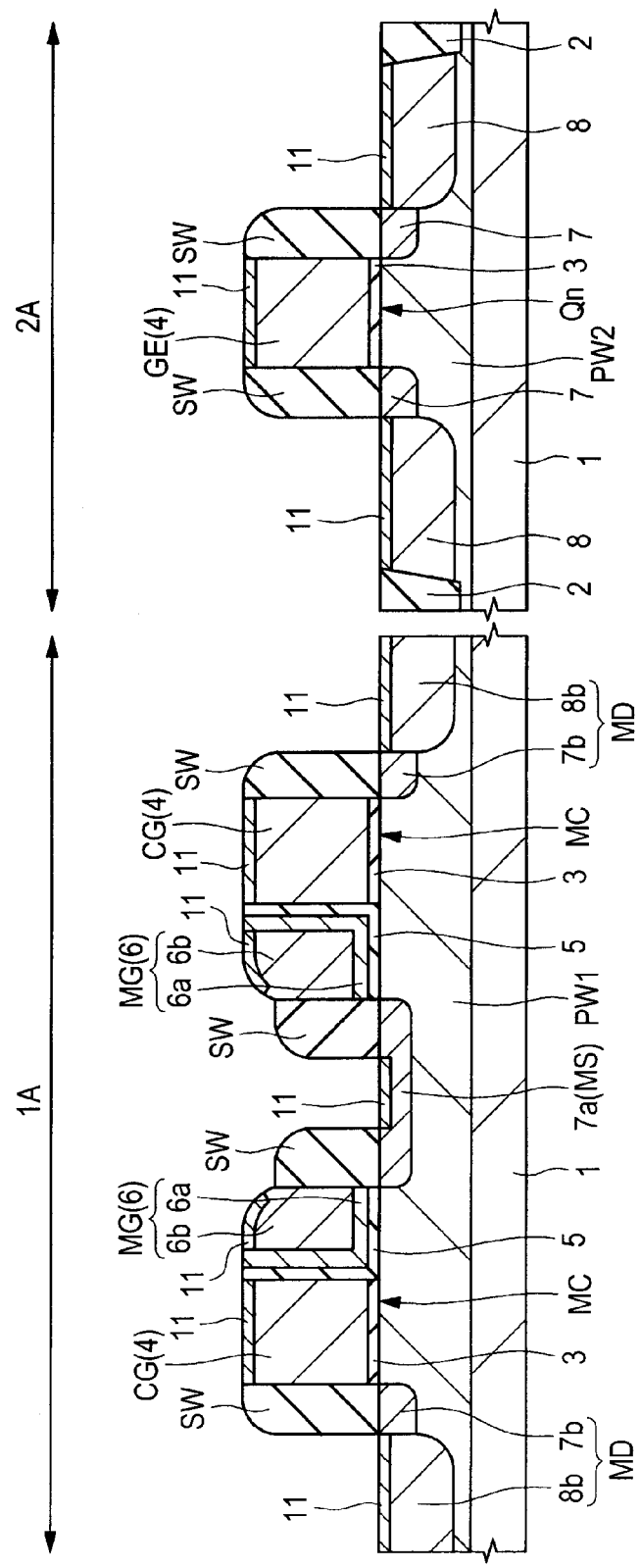

SEMICONDUCTOR DEVICE AND MANUFACTURING METHOD OF SEMICONDUCTOR DEVICE

CROSS-REFERENCE TO RELATED APPLICATIONS

The disclosure of Japanese Patent Application No. 2010-262394 filed on Nov. 25, 2010 including the specification, drawings and abstract is incorporated herein by reference in its entirety.

BACKGROUND

The present invention relates to semiconductor devices and manufacturing methods of semiconductor devices, and more particularly, to a technique effectively applied to a semiconductor device having a nonvolatile memory.

Flash memories are widely used as one type of an electrically erasable and programmable read only memory (EEPROM) which is an electrically writable and erasable nonvolatile semiconductor memory. The flash memory includes a conductive floating gate electrode or a trap insulating film enclosed by an oxide film under the gate electrode of a metal-insulator-semiconductor field-effect transistor (MISFET). The flash memory is designed to store information therein using a difference in threshold of the MISFET between the presence and absence of charges (electrons or holes) in the floating gate or trap insulating film.

For example, Japanese Unexamined Patent Publication No. 2006-303918 (Patent Document 1) discloses a technique for a MONOS-type nonvolatile memory in which a memory gate electrode is formed of a doped polycrystal silicon film consisting of two layers, namely, a high-concentration lower layer and a low-concentration upper layer.

Japanese Unexamined Patent Publication No. 2006-19373 (Patent Document 2) discloses a technique for a MONOS-type nonvolatile memory in which a memory gate is formed of a doped polycrystal silicon film so as to have a sheet resistance lower than that of a control gate formed of a polycrystal silicon film by ion-implanting impurities into an undoped silicon film.

Japanese Unexamined Patent Publication. No. 2004-186452 (Patent Document 3) discloses a technique for a MONOS-type nonvolatile memory which involves depositing a polycrystal silicon film doped with n-type impurities after forming a selection gate electrode, ion-implanting p-type impurities into a semiconductor substrate in this state, then depositing thereon another polycrystal silicon film doped with n-type impurities, and performing anisotropic etching on the two n-type impurity layers deposited to form a memory gate.

RELATED ART DOCUMENTS

Patent Documents

[Patent Document 1]
  Japanese Unexamined Patent Publication No. 2006-303918
[Patent Document 2]
  Japanese Unexamined Patent Publication No. 2006-19373
[Patent Document 3]
  Japanese Unexamined Patent Publication No. 2004-186452

SUMMARY

The inventors are involved in studying and developing flush memories. Particularly, the inventors have studied the improvement of characteristics of a split-gate nonvolatile memory. A memory gate electrode of the split-gate nonvolatile memory is formed of a doped silicon film containing impurities so as to reduce the resistance.

In recent years, the above semiconductor devices with the nonvolatile memory have been desired to have improved characteristics, including improved operating speed, improved data holding characteristics of the nonvolatile memory, and the like.

Accordingly, it is an object of the present invention to provide a technique that can improve the characteristics of a semiconductor device.

It is another object of the invention to provide a manufacturing method of a semiconductor device for manufacturing a semiconductor device with good characteristics by a better manufacturing process.

The above and other objects and the novel features of the invention will become apparent from the description of the present specification and the accompanying drawings.

The outline of representative aspects of the invention disclosed in the present application will be briefly described as follows.

A semiconductor device according to a typical embodiment of the invention disclosed in the present application includes a semiconductor substrate, a first gate electrode disposed over the semiconductor substrate, and a second gate electrode disposed over the semiconductor substrate so as to be adjacent to the first gate electrode. The semiconductor device further includes a first insulating film formed between the first gate electrode and the semiconductor substrate, and a second insulating film formed between the second gate electrode and the semiconductor substrate, and between the first gate electrode and the second gate electrode. The second insulating film includes therein a charge storing portion. The second gate electrode is comprised of a silicon film including a first silicon region positioned over the second insulating film, and a second silicon region positioned over the first silicon region. The second silicon region contains p-type impurities, and the concentration of the p-type impurities of the first silicon region is lower than that of the p-type impurities of the second silicon region.

A manufacturing method of a semiconductor device according to another typical embodiment of the invention disclosed in the present application includes the steps of (a) forming a first gate electrode over a semiconductor substrate via a first insulating film, and (b) forming a second insulating film including therein a charge storing portion, over the first gate electrode. The manufacturing method also includes the step of (c) forming, over the second insulating film, a multi-layer silicon film including a first silicon layer and a second silicon layer disposed over the first silicon layer. The second silicon layer has an impurity concentration higher than that of the first silicon layer. The manufacturing method further includes the step of (d) forming a second gate electrode by selectively removing the multi-layer silicon film to maintain a part of the multi-layer silicon film at a sidewall of the first gate electrode via the second insulating film.

A manufacturing method of a semiconductor device according to a further representative embodiment of the invention disclosed in the present application includes the steps of (a) forming a first gate electrode over a semiconductor substrate via a first insulating film, (b) forming a second insulating film including therein a charge storing portion, over the first gate electrode, and (c) forming a silicon film not containing impurities, over the second insulating film. The manufacturing method also includes the steps of (d) implanting ions of impurities into the silicon film, and (e) after the step (d), diffusing the impurity ions by heat treatment. The manufacturing method further includes (f) forming a second gate electrode by selectively removing the silicon film to maintain the silicon film at a sidewall of the first gate electrode via the second insulating film.

The following representative embodiments of the invention disclosed in the present application can provide a semiconductor device with improved characteristics.

The following representative embodiments of the invention disclosed in the present application can provide a manufacturing method for manufacturing a semiconductor device with good characteristics by a better manufacturing process.

BRIEF DESCRIPTION OF THE DRAWINGS

FIG. 14 is a cross-sectional view showing a main part of another manufacturing step of the semiconductor device in the first embodiment, following the step shown in FIG. 13;

FIG. 15 is a cross-sectional view showing a main part of another manufacturing step of the semiconductor device in the first embodiment, following the step shown in FIG. 14;

DETAILED DESCRIPTION

Figure 1:
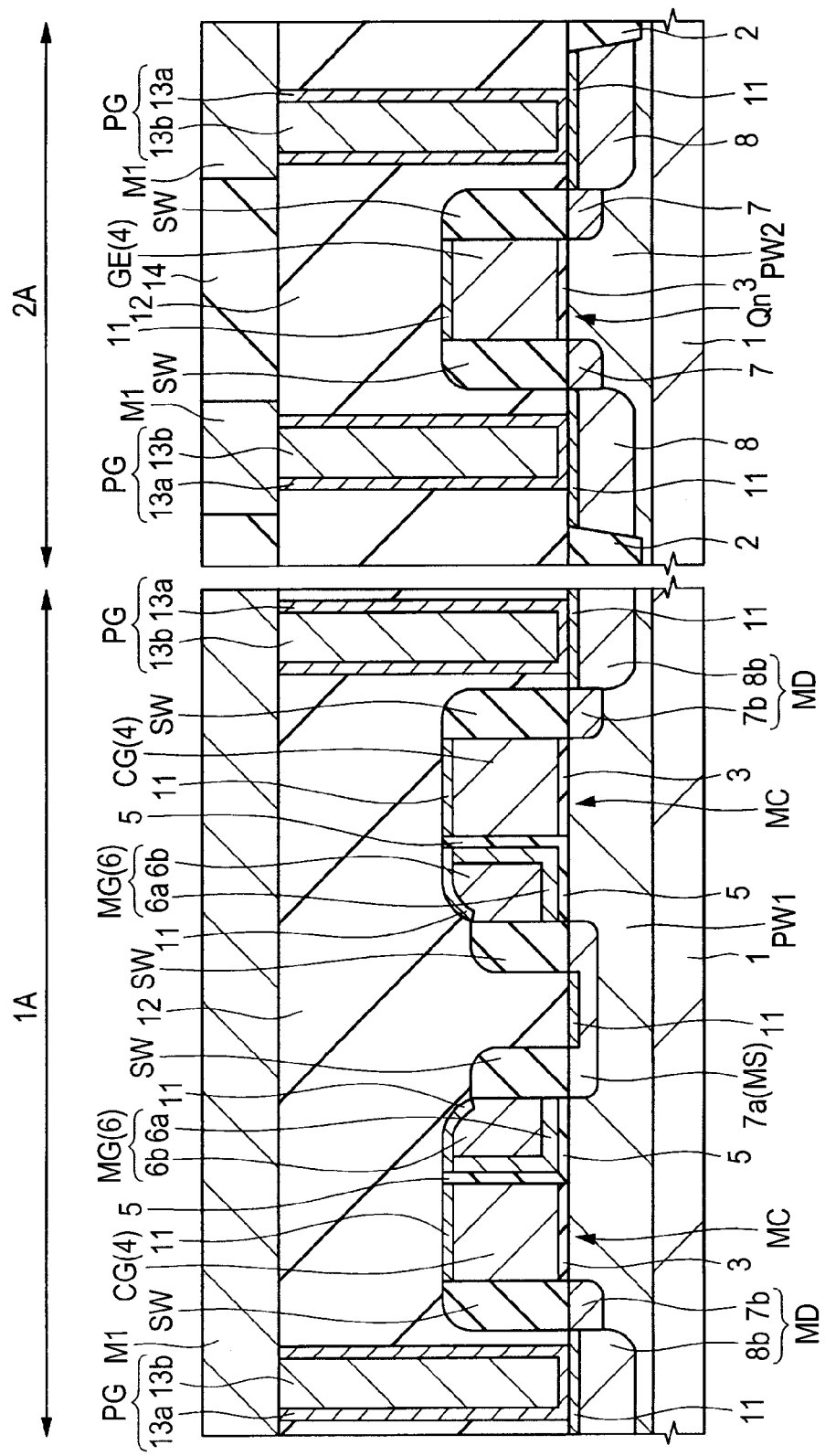
FIG. 1 is a cross-sectional view showing a main part of a semiconductor device according to a first embodiment.

The following preferred embodiments may be described below by being divided into a plurality of sections or embodiments for convenience, if necessary, which are not independent from each other except when specified otherwise. One of the sections or embodiments is a modified example, an application example, a detailed explanation, a supplemental explanation, or the like of a part or all of the other. When reference is made to the number of elements or the like (including the number of pieces, numerical values, quantity, range, etc.) in the following embodiments, the number thereof is not limited to a specific number, and may be more than, or less than, or equal to the specific number, unless otherwise specified, and except when definitely limited to the specific number in principle.

It is also needless to say that components (including elements or process steps, etc.) employed in the following description of the embodiments are not always essential, unless otherwise specified, and except when considered to be definitely essential in principle. Similarly, in the description of the shapes, positional relations and the like of the components or the like in the following embodiments, they will include those substantially analogous or similar to their shapes or the like, unless otherwise specified, and except when considered not to be definitely so in principle, etc. The same goes for the above-mentioned number (including the number of pieces, numerical value, quantity, range, and the like).

Now, preferred embodiments of the invention will be described below in detail based on the accompanying drawings. In all drawings for explanation of the embodiments, a member having the same function is designated by the same or related reference character, and thus a repeated description thereof will be omitted below. In the following embodiments, the description of the same or like parts is not repeated in principle if not necessary.

Among the drawings used for the embodiments, some cross-sectional views omit hatching for easy understanding. In contrast, some plan views make hatching for easy understanding.

The concentration of impurities used in this embodiment is a concentration measured by an energy dispersive X-ray spectroscopy (EDX) using a transmission electron microscope (TEM).

First Embodiment

A structure and a manufacturing method of a semiconductor device according to this embodiment will be described below in detail with reference to the accompanying drawings.

[Explanation of Structure]

Figure 2:
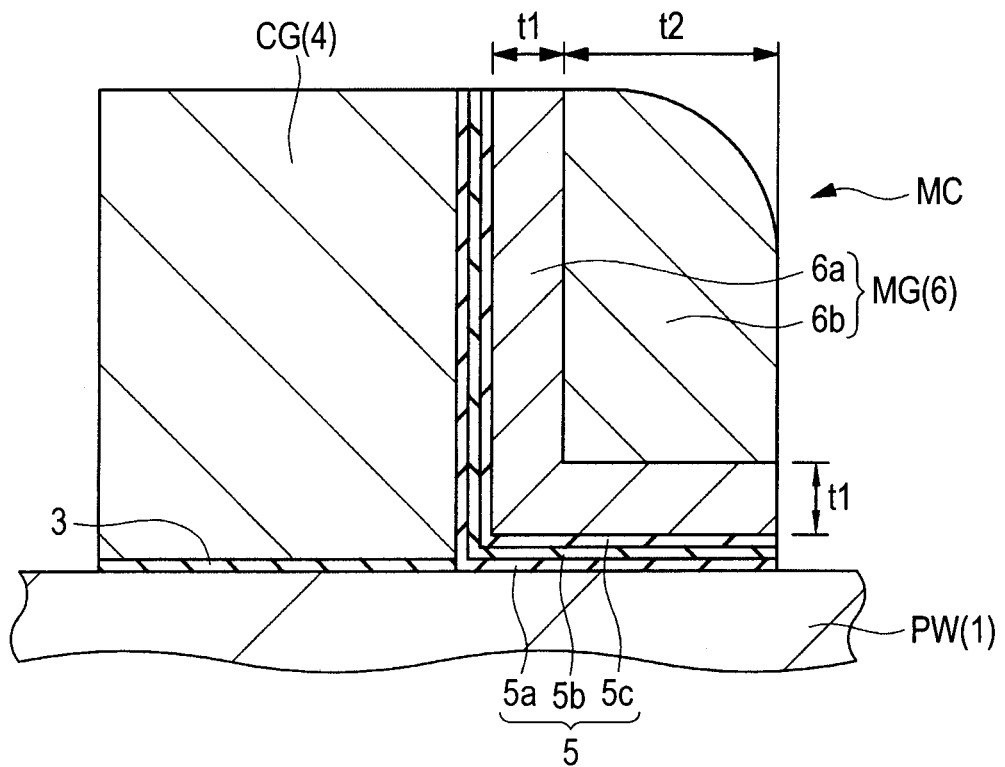
FIG. 2 is a partial enlarged cross-sectional view showing an enlarged part of FIG. 1.

FIG. 1 shows a cross-sectional view of a main part of a semiconductor device in this embodiment. FIG. 2 shows a partial enlarged cross-sectional view of an enlarged part of FIG. 1. FIGS. 1 and 2 show cross-sectional views of the semiconductor device obtained in the last step of the manufacturing process of the semiconductor device as will be described later.

The semiconductor device described in this embodiment includes a nonvolatile memory (nonvolatile semiconductor memory, such as an EEPROM, a flush memory, or a nonvolatile memory element), and a peripheral circuit thereof.

The nonvolatile memory is one using a trap insulating film (insulating film capable of storing charges therein) as a charge storing portion. A memory cell MC is a memory cell of a split gate type. That is, the memory cell MC is coupled to two MISFETs, namely, a control transistor (selection transistor) having a control gate electrode (selection gate electrode) CG, and a memory transistor having a memory gate electrode (gate electrode for the memory) MG.

A metal insulator semiconductor field effect transistor (MISFET) including the memory gate electrode MG and the gate insulating film with the charge storing portion (charge storing layer) is called a memory transistor (transistor for storing). Another MISFET including the gate insulating film and the control gate electrode CG is called a control transistor (selection transistor, or transistor for selection of a memory cell).

A peripheral circuit is a circuit for driving the nonvolatile memory, and is comprised of, for example, various types of logic circuits. Various logic circuits include, for example, an n-channel MISFET Qn and a p-channel MISFET to be described later.

As shown in FIG. 1, the semiconductor device of this embodiment includes a memory cell MC of a nonvolatile memory disposed in a memory cell region 1A of a semiconductor substrate 1, and an n-channel MISFET Qn disposed in a peripheral circuit region 2A. At the left of the figure, the cross-sectional view of a main part of the two memory cells MC sharing a source region (MS) is shown, whereas at the right of the figure, the cross-sectional view of a main part of the n-channel MISFET Qn forming the peripheral circuit is shown. The two memory cells are arranged substantially symmetric with respect to the source region (MS). A plurality of memory cells MC are further arranged in the memory cell region 1A. For example, on the more left side of the memory cell MC shown at the left of the memory cell region 1A in FIG. 1, another memory cell (not shown) sharing a drain region (MD) with the memory cell MC is arranged. In this way, the memory cells MC are arranged in the lateral direction (longitudinal direction of the gate) shown in FIG. 1 such that the shared source regions (MS) and the shared drain regions (MD) are alternatively arranged to form a row of memory cells. Further, the columns of the memory cells are arranged in the direction perpendicular to the paper surface of FIG. 1 (width direction of the gate). In this way, the memory cells MC are formed in the form of array.

As shown in FIG. 1, the semiconductor substrate (semiconductor wafer) 1 has element isolation regions 2 for isolating elements formed therein. In active regions partitioned (separated) by the element isolation regions 2, p-type wells PW1 and PW2 are formed.

In the cross-section of the memory cell region 1A, the element isolation region 2 does not appear, but the entire memory cell regions having the memory cells MC formed in the array are isolated by the element isolation regions 2. The element isolation regions 2 are appropriately disposed in positions, for example, where electrical isolation between the memory cell rows (except for the source region (MS)) is required.

First, the structure of the memory cells MC in the memory cell region 1A will be described below.

The memory cell MC includes a control gate electrode (first gate electrode) CG disposed above the semiconductor substrate 1 (p-type well PW1), and a memory gate electrode (second gate electrode) MG adjacent to the control gate electrode CG and disposed above the semiconductor substrate 1 (p-type well PW1). The memory cell MC further includes an insulating film 3 disposed between the control gate electrode CG and the semiconductor substrate 1 (p-type well PW1), and an insulating film 5 disposed between the memory gate electrode MG and the semiconductor substrate 1 (p-type well PW1), and between the memory gate electrode MG and the control gate electrode CG. The memory cell MC further includes a source region MS and a drain region MD formed in the p-type well PW1 of the semiconductor substrate 1.

The control gate electrode CG and the memory gate electrode MG are arranged in parallel over a main surface of the semiconductor substrate 1 in the lateral direction (longitudinal direction of the gate) shown in FIG. 1 with the insulating film 5 sandwiched between respective opposed sides (sidewalls) of the control gate CG and the memory gate MG. The extending direction of the control gate electrode CG and the memory gate electrode MG is the direction perpendicular to the paper surface shown in FIG. 1 (the width direction of the gate). The control gate electrode CG and the memory gate electrode MG are formed via the insulating films 3 and 5 over the semiconductor substrate 1 (p-type well PW1) between the drain region MD and the source region MS (note that the control gate electrode CG is formed via the insulating film 3 and that the memory gate electrode MG is formed via the insulating film 5). The memory gate electrode MG is located on the source region MS side, and the control gate electrode CG is located on the drain region MD side. The present application defines the source region MS and the drain region MD in the reading operation as a reference. A semiconductor region to which a high voltage is applied in a writing operation to be described later is called the source region MS, and another semiconductor region to which a low voltage is applied in the writing operation is called the drain region MD in a unified way.

The control gate electrode CG, and the memory gate electrode MG are adjacent to each other with the insulating film 5 intervening therein. The memory gate electrode MG is disposed at the sidewall of the control gate electrode CG via the insulating film 5 in the form of sidewall spacer. The insulating film 5 extends over both regions, namely, the region between the memory gate electrode MG and the semiconductor substrate 1 (p-type well PW1), and the region between the memory gate electrode MG and the control gate electrode CG.

The insulating film 3 (that is, the insulating film 3 under the control gate electrode CG) formed between the control gate electrode CG and the semiconductor substrate 1 (p-type well PW1) serves as a gate insulating film of the control transistor. The insulating film 5 (that is, the insulating film 5 under the memory gate electrode MG) formed between the memory gate electrode MG and the semiconductor substrate 1 (p-type well PW1) serves as a gate insulating film of the memory transistor (gate insulating film including therein a charge storing portion).

The insulating film 3 can be formed of, for example, a silicon oxide film or a silicon oxynitride film. The insulating film 3 may be formed using a metal oxide film having a dielectric constant higher than that of the silicon nitride film, such as a hafnium oxide film, an aluminum oxide film (alumina), or a tantalum oxide film, in addition to the above silicon oxide film or silicon oxynitride film.

As shown in FIG. 2, the insulating film 5 is comprised of a laminated film as an insulating film, for example, including a silicon oxide film (oxide film) 5a, a silicon nitride film (nitride film, or charge storing layer) 5b on the silicon oxide film 5a, and a silicon oxide film (oxide film) 5c on the silicon nitride film 5b.

For easy understanding, FIG. 1 simply shows the laminated film comprised of the silicon oxide film 5a, the silicon nitride film 5b, and the silicon oxide film 5c as the single insulating film 5 (note that the same goes for FIGS. 5 to 15).

A silicon nitride film 5b of the insulating film 5 is an insulating film for storing charges and serving as a charge storing layer (charge storing portion). That is, the silicon nitride film 5b is a trap insulating film formed in the insulating film 5. That is, the insulating film 5 can be regarded as an insulating film including therein the charge storing portion (charge storing layer, namely, the silicon nitride film 5b).

The silicon oxide film 5c and the silicon oxide film 5a positioned above and below the silicon nitride film 5b serve as a charge blocking layer (charge blocking film, or charge trapping layer).

In this way, sandwiching the silicon nitride film 5b between the silicon oxide film 5c and the silicon oxide film 5a enables the storing of charges in the silicon nitride film 5b. The laminated film of the silicon oxide film 5a, the silicon nitride film 5b, and the silicon oxide film 5c is often called ONO (oxide-nitride-oxide) film.

One part of the insulating film 5 located between the memory gate electrode MG and the semiconductor substrate 1 (p-type well PW1) serves as a gate insulating film of a memory transistor with or without charges (electrons or holes) stored. The other part of the insulating film 5 between the memory gate electrode MG and the control gate electrode CG serves as an insulating film for insulating (electrically isolating) the memory gate electrode MG and the control gate electrode CG.

A channel region of the memory transistor is formed under the insulating film 5 below the memory gate electrode MG, and a channel region of the control transistor is formed under the insulating film 3 below the control gate electrode CG. The channel formation region of the control transistor under the insulating film 5 below the control gate electrode CG has a semiconductor region (p-type semiconductor region or n-type semiconductor region) formed for adjustment of a threshold of the control transistor, if necessary. The channel formation region of the memory transistor under the insulating film 3 below the memory gate electrode MG has a semiconductor region (p-type semiconductor region or n-type semiconductor region) formed for adjustment of the threshold of the memory transistor, if necessary.

As described above, in the writing operation, the source region MS is a semiconductor region to which a high voltage is applied, and the drain region MD is a semiconductor region to which a low voltage is applied. These regions MS and MD are comprised of a semiconductor region (n-type impurity diffusion layer) into which n-type impurities are introduced.

Among these regions, the drain region MD is a region having a lightly doped drain (LDD) structure. That is, the drain region MD includes an $n^-$-type semiconductor region (low concentration impurity diffusion layer) 7b, and an $n^+$-type semiconductor region (high concentration impurity diffusion layer) 8b having a concentration higher than that of the $n^-$-type semiconductor region 7b. The $n^+$-type semiconductor region 8b has a junction depth larger than that of the $n^-$-semiconductor region 7b, and an impurity concentration higher than that of the region 7b.

In contrast, the source region MS does not have the LDD structure, and is comprised of only the $n^-$-semiconductor region (low concentration impurity diffusion layer) 7a. The $n^-$-semiconductor region 7a is an n-type impurity region having a concentration lower than that of the $n^+$-type semiconductor region (high concentration impurity diffusion layer) 8b. For example, the semiconductor region 7a is the region having a concentration of the order of $n \times E20/cm^3$ (n: 1 to 10) or less, preferably, the region having a concentration of $2 \times E20/cm^3$ or less. The term "E20" as used herein represents 10 raised to the power of 20 ($10^{20}$). For example, the $n^-$-type semiconductor region 7a can have substantially the same junction depth as that of the $n^-$-type semiconductor region 7b. The $n^-$-semiconductor region 7a has an impurity concentration lower than that of the $n^+$-type semiconductor region 8b, and a junction depth smaller than that of the $n^+$-type semiconductor region 8b.

A sidewall insulating film (sidewall, or sidewall spacer) SW is formed of an insulator (silicon oxide film, or insulating film), such as a silicon oxide, at each sidewall of a combination pattern of the memory gate electrode MG and the control gate electrode CG. That is, the sidewall insulating films SW are formed over the sidewall (side) of the memory gate electrode MG opposite to the other side of the electrode MG adjacent to the control gate electrode CG via the insulating film 5, and over the sidewall (side) of the control gate electrode CG opposite to the other side of the electrode CG adjacent to the memory gate electrode MG via the insulating film 5.

The $n^-$-type semiconductor region 7a in the source region MS is formed in a self-aligned manner with respect to the sidewall of the memory gate electrode MG. Thus, the low-concentration $n^-$-type semiconductor region 7a is formed under the sidewall insulating film SW at the sidewall of the memory gate electrode MG. Thus, the low concentration $n^-$-type semiconductor region 7a is formed adjacent to the channel region of the memory transistor.

The $n^-$-type semiconductor region 7b in the drain region MD is formed in a self-aligned manner with respect to the sidewall of the control gate electrode CG. The $n^+$-type semiconductor region 8b is formed in a self-aligned manner with respect to the side of the sidewall insulating film SW on the control gate electrode CG side. Thus, the low concentration $n^-$-type semiconductor region 7b is formed under the sidewall insulating film SW on the control gate electrode CG side. The high concentration $n^+$-type semiconductor region 8b is formed outside the low concentration $n^-$-type semiconductor region 7b. Accordingly, the low concentration $n^-$-type semiconductor region 7b is formed adjacent to the channel region of the control transistor. The high concentration n+-type semiconductor region 8b is formed in contact with the low concentration n−-type semiconductor region 7b so as to be spaced apart from the channel region of the control transistor by the n−-type semiconductor region 7b.

The control gate electrode CG is comprised of a conductive film (conductor film), preferably a silicon film 4, such as an n-type polycrystal silicon film (polycrystal silicon film with n-type impurities introduced into, or doped polysilicon film). The silicon film 4 is an n-type silicon film with n-type impurities introduced thereinto to have a low resistance. Specifically, the control gate electrode CG is comprised of the patterned silicon film 4.

The memory gate electrode MG is formed of the silicon film 6 as shown in FIGS. 1 and 2. A part of the silicon film 6 located around a region adjacent to the insulating film 5 is formed of a non-doped silicon film 6a, and the region extends along the surface of the semiconductor substrate 1. A doped silicon film 6b with p-type impurities introduced thereinto is formed in the region over the non-doped silicon film 6a. In other words, the silicon film 6 is a lamination of the non-doped silicon film 6a and the doped silicon film 6b. The non-doped silicon film 6a is formed as a lower layer, and the doped silicon film 6b is formed as an upper layer. The non-doped silicon film 6a is the non-doped (undoped) silicon film. The doped silicon film 6b is the silicon film with p-type impurities introduced (doped) thereinto. The p-type impurities include, for example, boron (B, indium (In), and the like.

The term "non-doped silicon film" as used herein means a silicon film (intrinsic silicon film) into which impurities are not contained (introduced, added, doped, or implanted). It is noted that the term "non-doped silicon film" does not exclude a silicon film with impurities unintentionally introduced thereinto in a small amount. On the other hand, the term "silicon film with impurities introduced (doped)" means a silicon film with impurities intentionally contained (introduced, added, doped, or implanted) thereinto.

Thus, the concentration of impurities of the doped silicon film 6b is higher than that of impurities of the non-doped silicon film 6a. The resistivity (specific resistance) of the doped silicon film 6b is lower than that of the non-doped silicon film 6a.

As mentioned above, the non-doped silicon film 6a is formed as a lower layer, and the doped silicon film 6b is formed as an upper layer. That is, the non-doped silicon film 6a is located over the insulating film 5, and the doped silicon film 6b is located over the non-doped silicon film 6a.

In this embodiment, the non-doped silicon film 6a and the insulating film 5 also intervene in between the doped silicon film 6b and the control gate electrode CG (see FIGS. 1 and 2). That is, the non-doped silicon film 6a includes a part positioned in parallel to the surface of the semiconductor substrate 1 (p-type well PW1), namely, a horizontal part formed horizontally, and a vertical part extending substantially vertically to the surface of the substrate 1. The insulating film 5 includes a part positioned in parallel to the surface of the semiconductor substrate 1, namely, a horizontal part formed horizontally, and a vertical part extending substantially vertically to the surface of the substrate 1. In other words, each of the insulating film 5 and the non-doped silicon film 6a is formed in an L-like or inverted L-like shape at the cross-section in the longitudinal direction of the gate.

Metal silicide layers (metal silicide films) 11 are formed above (over an upper surface of) the memory gate electrode MG, above (over an upper surface of) the control gate electrode CG, and over upper surfaces (surfaces) of the n−-type semiconductor region 7a and the n+-type semiconductor region 8b. The metal silicide layer 11 is comprised of, for example, a cobalt silicide layer or a nickel silicide layer. The metal silicide layer 11 can reduce a diffusion resistance or contact resistance. For the purpose of preventing the short-circuit between the memory gate electrode MG and the control gate electrode CG as much as possible, the metal silicide layer 11 is not formed over one or both of the memory gate electrode MG and the control gate electrode CG in some cases.

Next, the n-channel MISFET Qn in the peripheral circuit region 2A will be described below.

Referring to the right side of FIG. 1, the n-channel MISFET Qn includes a gate electrode GE disposed over the semiconductor substrate 1 (p-type well PW2), the insulating film 3 disposed between the gate electrode GE and the semiconductor substrate 1 (p-type well PW2), and source and drain regions (7, 8) formed in parts of the semiconductor substrate 1 (p-type well PW2) located on both sides of the gate electrode GE.

The direction of extension of the gate electrode GE is the direction perpendicular to the paper surface of FIG. 1 (width direction of the gate). The insulating film 3 disposed between the gate electrode GE and the semiconductor substrate 1 (p-type well PW2) serves as a gate insulating film of the n-channel MISFET Qn. A channel region of the n-channel MISFET Qn is formed under the insulating film 3 below the gate electrode GE.

Each of the source and drain regions (7, 8) has an LDD structure including the n+-type semiconductor region 8 and the n−-type semiconductor region 7. The n+-type semiconductor region 8 has a junction depth larger than that of the n−-type semiconductor region 7, and has an impurity concentration higher than that of the n−-type semiconductor region 7.

A sidewall insulating film (sidewall, sidewall spacer) SW comprised of an insulator (silicon oxide film or insulating film) of silicon oxide or the like is formed on each of the sidewalls of the gate electrode GE.

The n−-type semiconductor region 7 is formed in a self-aligned manner with respect to the sidewall of the gate electrode GE. Thus, the low concentration n−-type semiconductor region 7 is formed under the sidewall insulating film SW at each sidewall of the gate electrode GE. Thus, the low concentration n−-type semiconductor region 7 is formed adjacent to the channel region of the MISFET. The n+-type semiconductor region 8 is formed in a self-aligned manner with respect to the side of each sidewall insulating film SW. In this way, the low concentration n−-type semiconductor region 7 is formed adjacent to the channel region of the MISFET, and the high concentration n+-type semiconductor region 8 is formed adjacent to the low concentration n−-type semiconductor region 7 so as to be spaced apart from the channel region of the MISFET by the region 7.

The gate electrode GE is comprised of a conductive film (conductor film), and is preferably the silicon film 4 comprised of, for example, an n-type polycrystal silicon film (polycrystal silicon film with n-type impurities introduced thereinto, or doped polycrystal silicon film), like the above control gate electrode CG.

The metal silicide layer 11 is formed above (over the upper surface of) the gate electrode GE and over the upper surface (surface) of the n+-type semiconductor region 8. The metal silicide layer 11 is comprised of, for example, a cobalt silicide layer or nickel silicide layer. The metal silicide layer 11 can reduce a diffusion resistance or contact resistance.

[Explanation of Operation]

Figures 3, 4:
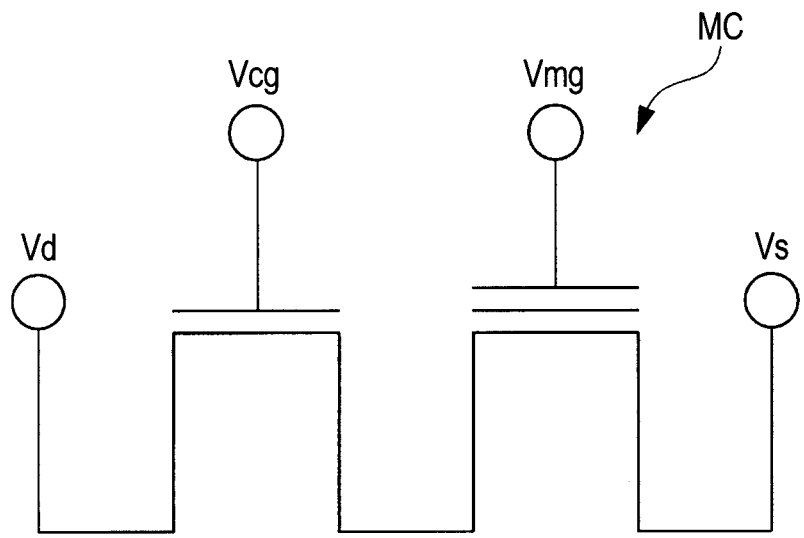
FIG. 3 is an equivalent circuit diagram of a memory cell.
FIG. 4 is a table showing an example of the conditions for application of voltages to respective parts of a selection memory cell at the time of each of "writing", "erasing", and "reading" operations.

FIG. 3 shows an equivalent circuit diagram of a memory cell MC. As shown in the figure, the memory transistor and the control transistor are coupled in series between the drain region (MD) and the source region (MS) to form one memory cell. FIG. 4 shows a table of an example of the conditions for application of voltages to respective parts of a selection memory cell at the time of each of "writing", "erasing", and "reading" operations in this embodiment. The table of FIG. 4 describes a voltage Vmg applied to the memory gate electrode MG, a voltage Vs applied to the source region (source region MS), a voltage Vcg applied to the control gate electrode CG, a voltage Vd applied to the drain region (drain region MD), and a voltage Vb applied to the p-type well PW1 at the time of each of the "writing", "erasing", and "reading" operations. The table of FIG. 4 shows a preferable example of the application conditions of voltages, but the invention is not limited thereto. Various modifications can be made to the conditions if necessary. In this embodiment, the implantation of electrons into the silicon nitride film 5b as a charge storing layer (charge storing portion) in the insulating film 5 of the memory transistor is defined as "writing", and the implantation of holes is defined as "erasing".

The writing system can be performed using a hot electron writing method called "SSI (source side injection)". For example, such a voltage as represented in the column of "writing" of FIG. 4 is applied to each part of the selection memory cell for writing, and electrons are introduced into the silicon nitride film 5b of the insulating film 5 of the selection memory cell. Hot electrons are generated in the channel region (between the source and drain) under between the two gate electrodes (the memory gate electrode MG and the control gate electrode CG), and are then implanted into the silicon nitride film 5b as the charge storing layer (charge storing portion) of the insulating film 5 under the memory gate electrode MG. The hot electrons (electrons) implanted are captured at a trap level in the silicon nitride film 5b of the insulating film 5, which results in an increase in threshold voltage of the memory transistor.

The erasing method can be performed using a band-to-band tunneling (BTBT) hot hole implantation erasing system. That is, the erasing operation is performed by implanting the holes generated by the BTBT (band-to-band tunneling phenomenon) into the charge storing portion (silicon nitride film 5b of the insulating film 5). For example, such a voltage as represented in the column of "erasing" of FIG. 4 is applied to each part of the selection memory cell for erasing, and holes are generated by the BTBT phenomenon to accelerate an electric field, so that the holes are implanted into the silicon nitride film 5b of the insulating film 5 of the selection memory cell, which results in a decrease in threshold voltage of the memory transistor.

In the reading operation, for example, such a voltage as represented in the column of "reading" of FIG. 4 is applied to each part of the selection memory cell for reading. The voltage Vmg to be applied to the memory gate electrode MG in the reading operation is set to a value between a threshold voltage of the memory transistor in a writing state and a threshold voltage of the memory transistor in an erasing state. Thus, the determination of the writing state or erasing state can be performed based on whether or not current flows through the memory cell.

Although this embodiment has described above the SSI system as the writing method and the BTBT hot hole implantation erasing system as the erasing method, the invention is not limited thereto. The writing or erasing operation can be performed by an operation method using the tunneling of electrons or holes, such as a fowler nordheim (FN) system.

[Explanation of Manufacturing Method]

Next, referring to FIGS. 5 to 15, a manufacturing method of the semiconductor device according to this embodiment will be described below while clarifying the structure of the semiconductor device. FIGS. 5 to 15 are cross-sectional views of main parts of the manufacturing steps of the semiconductor device in this embodiment.

Figure 5:
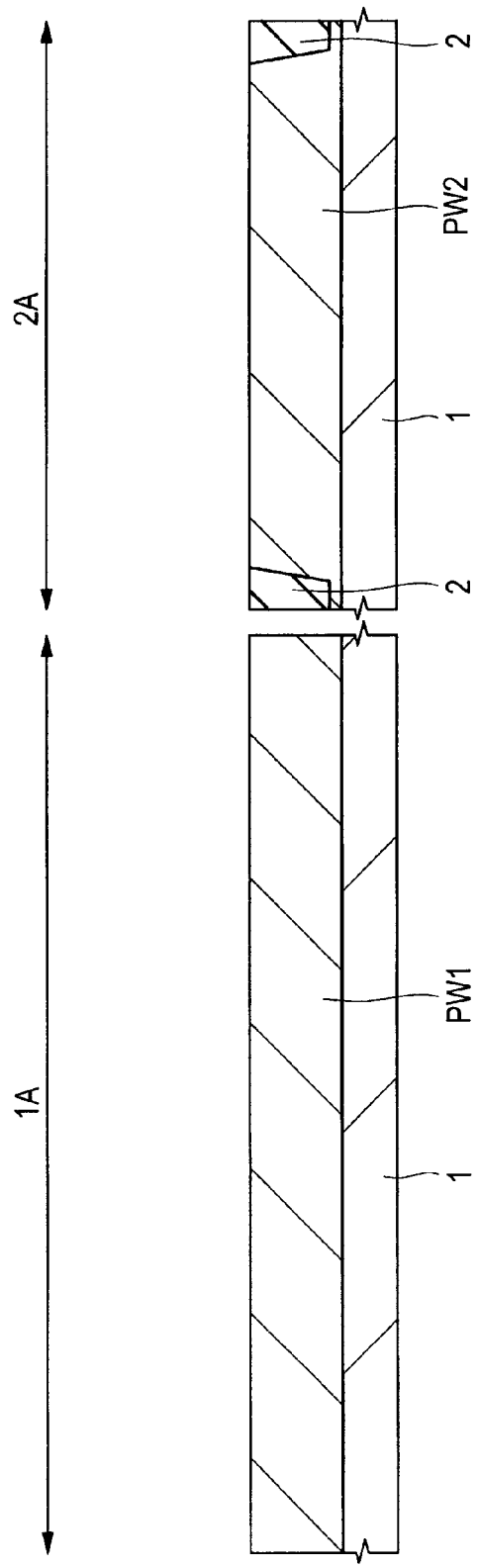
FIG. 5 is a cross-sectional view showing a main part of a manufacturing step of the semiconductor device in the first embodiment.

First, as shown in FIG. 5, a silicon substrate comprised of p-type single crystal silicon and having a specific resistance of about 1 to 10 Ωcm is prepared as a semiconductor substrate (semiconductor wafer) 1. The semiconductor substrate 1 other than the silicon substrate may be used.

The above semiconductor substrate 1 includes a memory cell region 1A with the memory cells MC of the nonvolatile memory formed therein, and a peripheral circuit region 2A with an n-channel MISFET Qn included in the peripheral circuit.

Then, the element isolation regions 2 are formed at the main surface of the semiconductor substrate 1. For example, element isolation trenches are formed in the semiconductor substrate 1 and an insulating film is embedded in each element isolation trench to form the element isolation region 2. Such an element isolation method is called shallow trench isolation (STI) method. In addition, the element isolation region 2 may be formed using a local oxidization of silicon (LOCOS) method or the like.

Then, the p-type well PW1 is formed in the memory cell region 1A of the semiconductor substrate 1, and the p-type well PW2 is formed in the peripheral circuit region 2A of the substrate 1. The p-type wells PW1 and PW2 are formed by ion-implanting p-type impurities (for example, boron (B) or the like).

Figure 6:
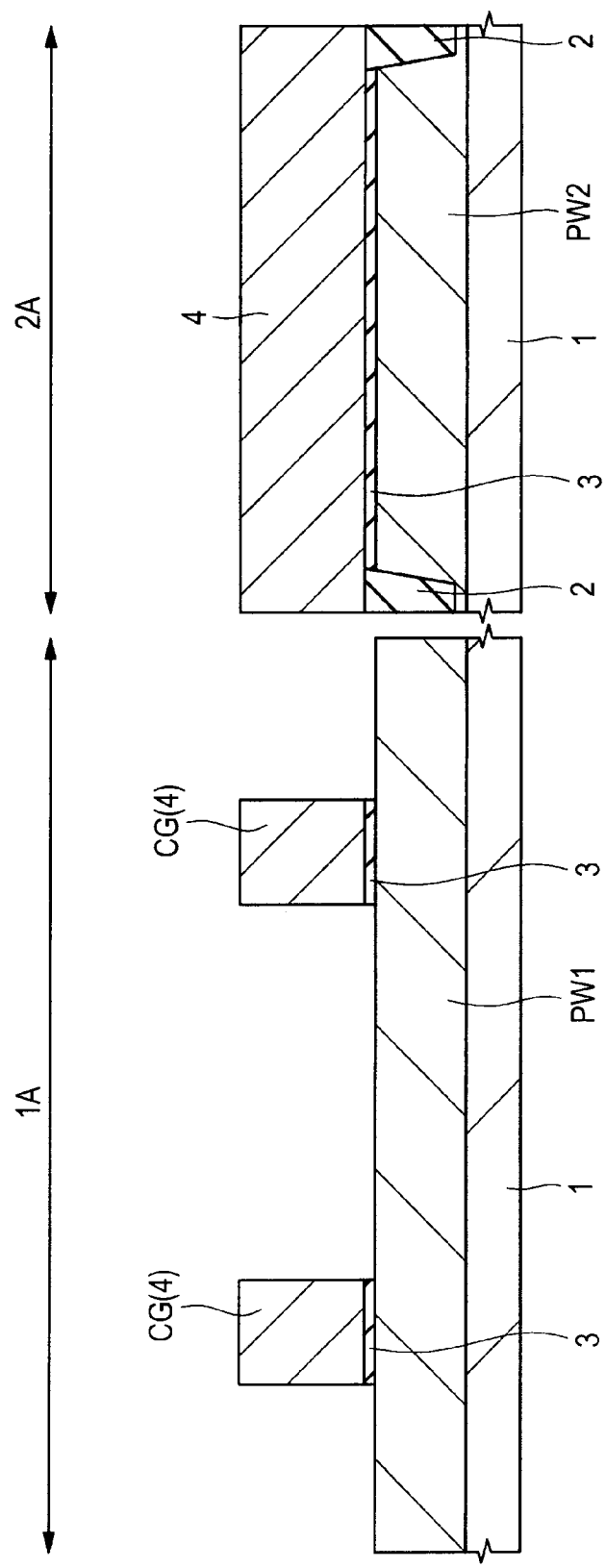
FIG. 6 is a cross-sectional view showing a main part of another manufacturing step of the semiconductor device in the first embodiment, following the step shown in FIG. 5.

After cleaning the surface of the semiconductor substrate 1 (p-type wells PW1 and PW2) by a diluted hydrofluoric acid or the like, as shown in FIG. 6, the insulating film (gate insulating film) 3 is formed over the main surface of the semiconductor substrate 1 (surfaces of the p-type wells PW1 and PW2) in a thickness of about 2 to 3 nm, for example, by applying thermal oxidation to a silicon oxide film. The insulating film 3 can also be formed using other insulating films, such as a silicon oxynitride film, in addition to the silicon oxide film. The insulating film 3 can also be formed not only by the thermal oxidation, but also a chemical vapor deposition (CVD) method.

Then, the silicon film 4 is formed as a conductive film (conductor film) over the entire surface of the semiconductor substrate 1. The silicon film 4 is formed by depositing a polycrystal silicon film containing n-type impurities (for example, arsenic (As) or phosphorus (P)) using the CVD method or the like in a thickness of about 100 to 200 nm. The silicon film 4 may be formed by depositing an amorphous silicon film and crystallizing the silicon film by a heat treatment. When introducing the n-type impurities during deposition of the silicon film 4, the silicon film 4 containing n-type impurities can be deposited by containing a doping gas (gas for addition of n-type impurities) into gas for deposition. After depositing the silicon film, n-type impurities (impurity ions) may be introduced into the silicon film by the ion implantation method.

Then, a photoresist film (not shown) is formed in a region where the control gate electrode CG of the silicon film 4 is to be formed, by using a photolithography method, and then the silicon film 4 is etched using the photoresist film as a mask. Thereafter, a part of the photoresist film is removed by ashing or the like to form the control gate electrode CG. Such a series of steps from the photolithography to the removal of the photoresist film are called "patterning".

In the memory cell region 1A, the insulating film 3 remaining under the control gate electrode CG serves as a gate insulating film of the control transistor. The insulating film 3 except for the parts thereof covered with the control gate electrode CG can be removed by the following patterning steps and the like.

Then, if necessary, channel dope ion implantation is performed on the surface (superficial layer) of the p-type well PW1 in the memory cell region 1A so as to adjust the threshold voltage of the memory transistor.

Figure 7:
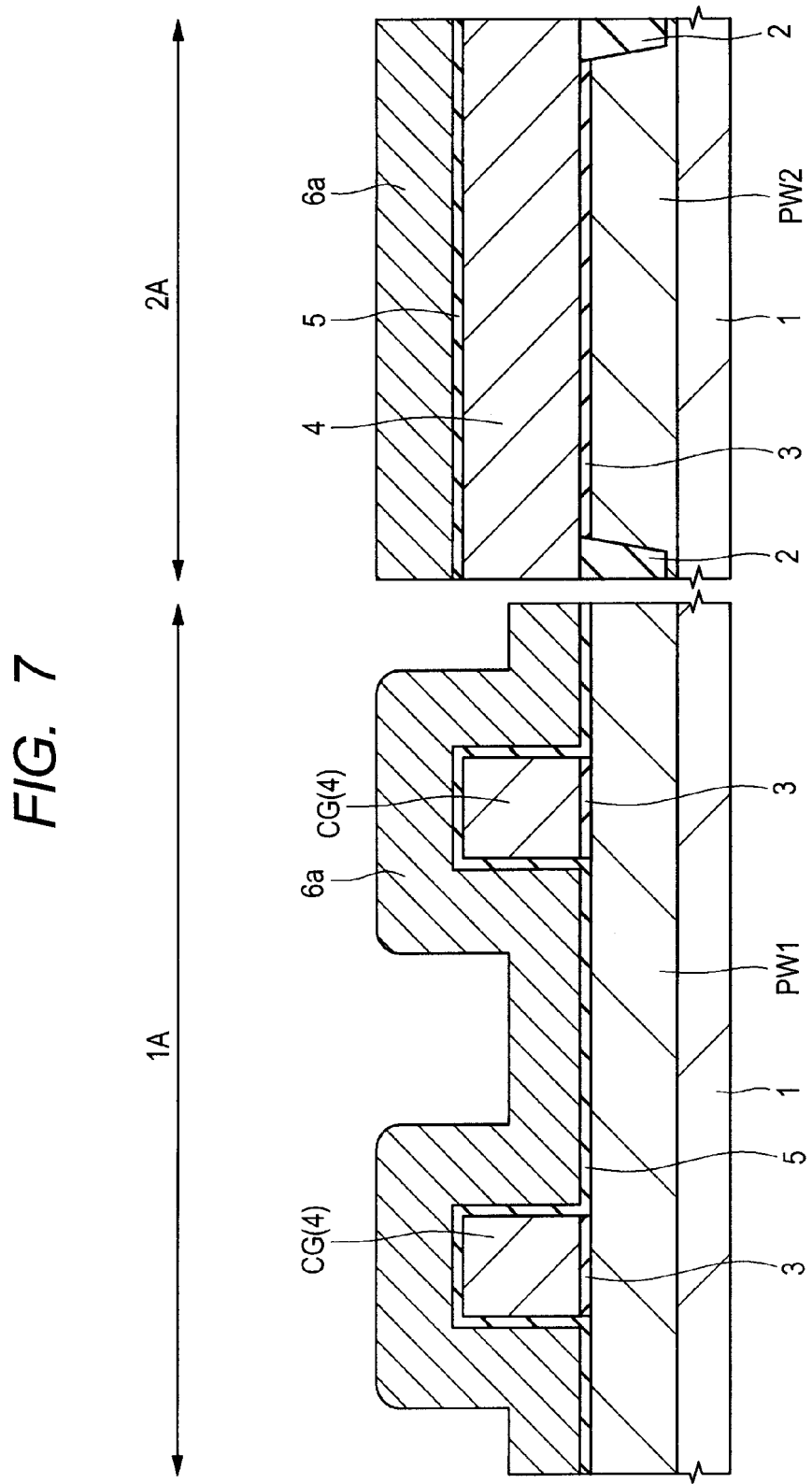
FIG. 7 is a cross-sectional view showing a main part of another manufacturing step of the semiconductor device in the first embodiment, following the step shown in FIG. 6.

Then, after cleaning the main surface of the semiconductor substrate 1, as shown in FIG. 7, an insulating film including therein a charge storing portion is formed as the insulating film (gate insulating film) 5 over the semiconductor substrate 1 including the surface (upper surface and sides) of the control gate electrode CG. The insulating film 5 is formed of a lamination comprised of the silicon oxide film 5a, the silicon nitride film 5b, and the silicon oxide film 5c which are laminated in that order from the bottom. For example, first, the silicon oxide film 5a is formed over the surface of the semiconductor substrate 1 (p-type well PW1) and the surface (sides and upper surface) of the control gate electrode CG, for example, in a thickness of about 3 to 6 nm by the thermal oxidation (preferably, in situ steam generation (ISSG) oxidation). Then, the silicon nitride film 5b is deposited by the CVD method, for example, in a thickness of about 5 to 10 nm. Further, the silicon oxide film 5c is formed by the CVD method, for example, in a thickness of about 4 to 7 nm. In this way, the insulating film 5 comprised of the silicon oxide film 5a, the silicon nitride film 5b, and the silicon oxide film 5c can be formed (see FIG. 2). The silicon oxide film 5a may be formed by the CVD method. An upper layer part of the silicon nitride film 5b may be oxidized to form the silicon oxide film 5c. In this case, the breakdown voltage of the silicon oxide film 5c becomes large.

Although in this embodiment the silicon nitride film 5b is formed as the charge storing portion inside the insulating film 5 (charge storing layer, or insulating film having the trap level), other insulating films, such as an aluminum oxide film, a hafnium oxide film, or a tantalum oxide film, may be used. These films are high dielectric constant films having a dielectric constant higher than that of the silicon nitride film. The charge storing layer may be formed of a silicon nano-dot.

The insulating film 5 formed in the memory cell region 1A serves as a gate insulating film of the memory gate electrode MG and has a function of holding charges (storing charges). Thus, the insulating film 5 is configured to have at least three layered lamination in which the potential barrier of the inner layer (silicon nitride film 5b) is lower than that of the outer layers (silicon oxide films 5a and 5c).

Subsequently, a non-doped polycrystal silicon film is formed as the non-doped silicon film 6a over the insulating film 5 in a thickness of about 30 to 80 nm by use of the CVD method or the like. That is, during the deposition process, the polycrystal silicon film (6a) is deposited without containing doping gas (gas for addition of impurities) in a raw material gas.

Figure 8:
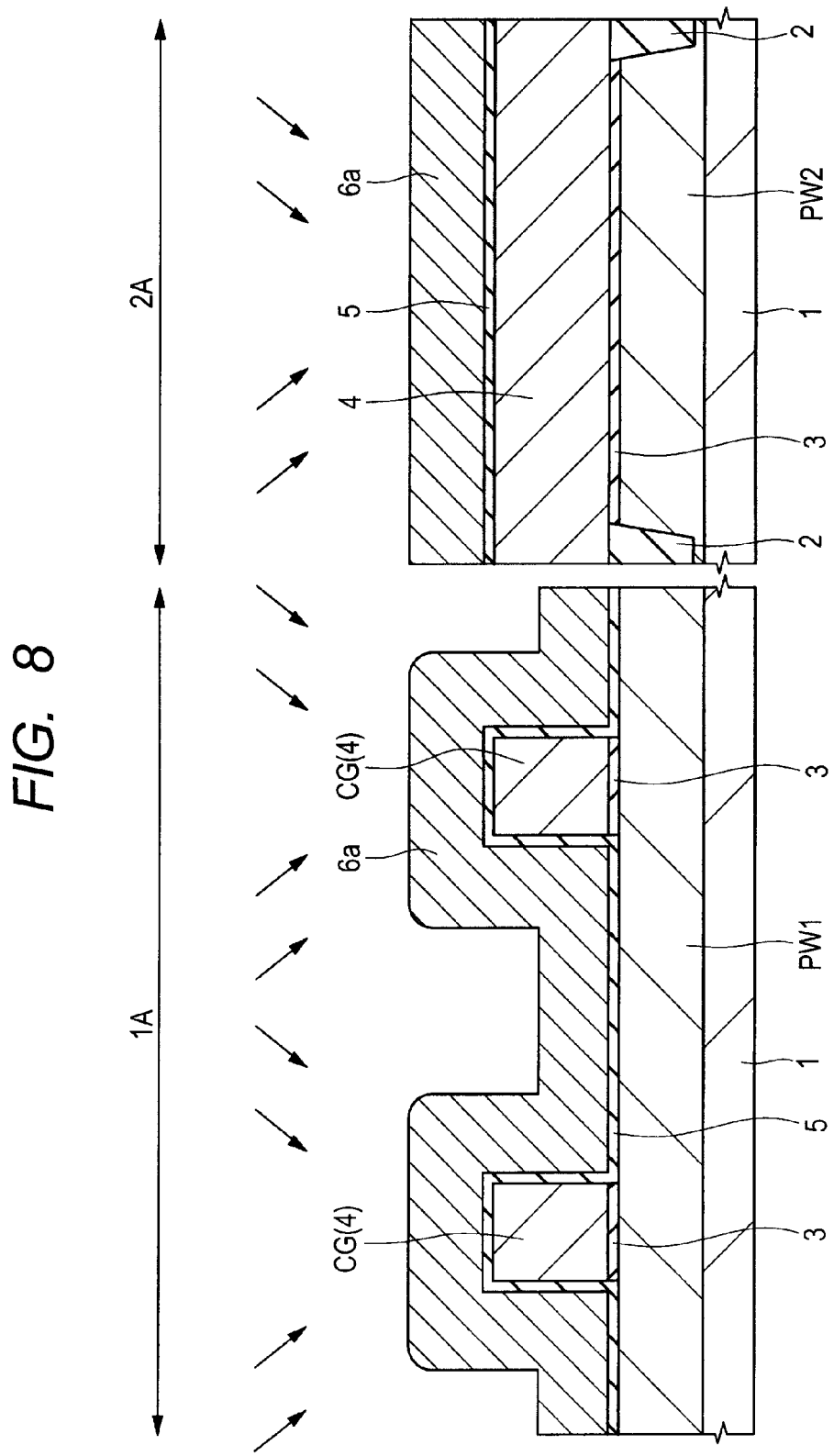
FIG. 8 is a cross-sectional view showing a main part of another manufacturing step of the semiconductor device in the first embodiment, following the step shown in FIG. 7.
Figure 9:
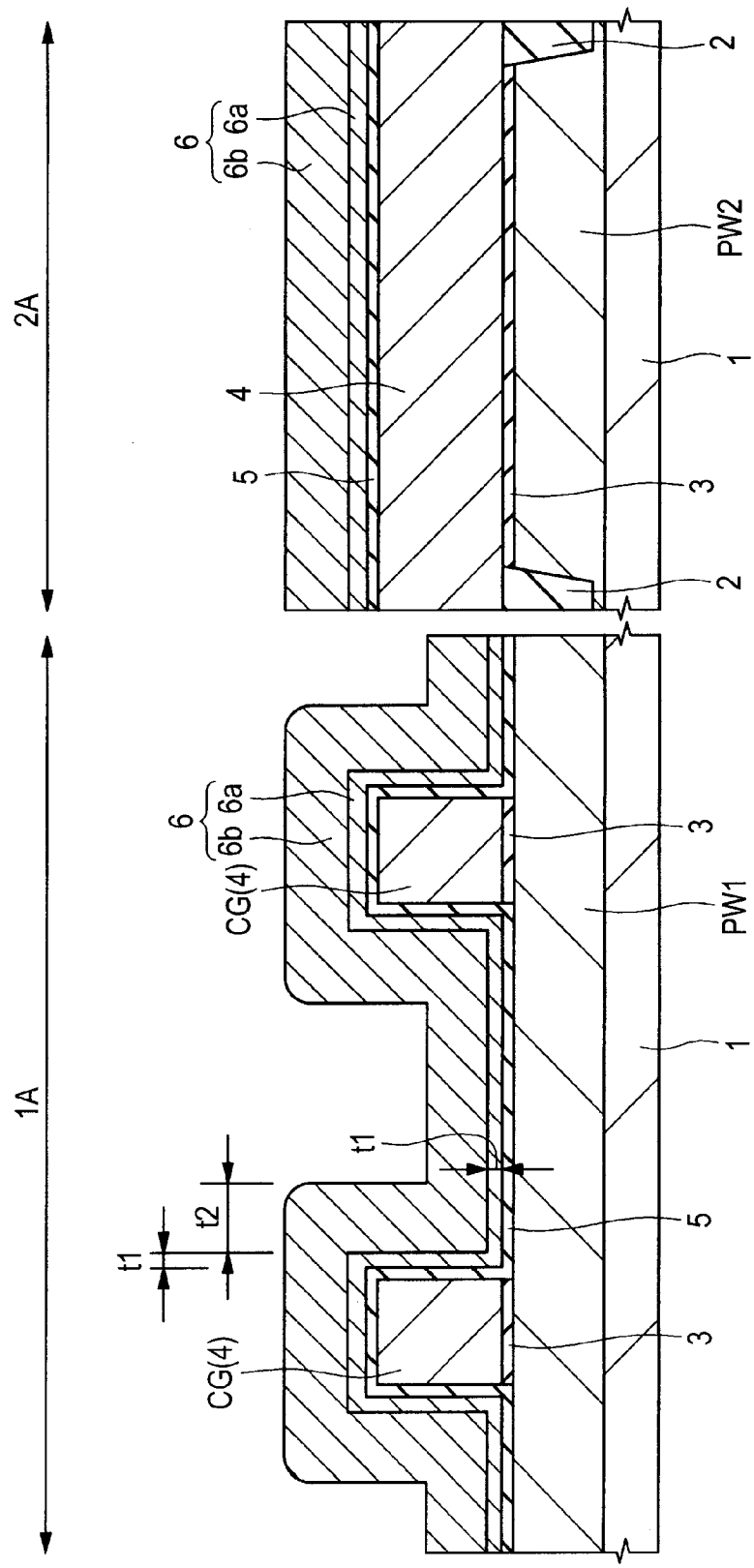
FIG. 9 is a cross-sectional view showing a main part of another manufacturing step of the semiconductor device in the first embodiment, following the step shown in FIG. 8.

Then, as shown in FIGS. 8 and 9, the doped silicon film (doped silicon layer, or doped silicon portion) 6b is formed over the surface of the non-doped silicon film 6a. The doped silicon film 6b is formed by oblique ion implantation of p-type impurities (for example, boron (B), indium (In), or the like) into the surface of the non-doped silicon film 6a (see FIG. 8).

As shown in FIG. 8, in the oblique ion implantation step, p-type impurities are implanted at a predetermined angle θ of less than 90° (for example, 45°) with respect to the semiconductor substrate 1, and further p-type impurities are implanted at an angle 180-θ° (for example, 135°) with respect to the substrate 1. By this oblique ion implantation, the p-type impurities are also implanted into the surface of the non-doped silicon film 6a positioned on each side of the control gate electrode CG.

The impurities of boron are ion-implanted, for example, in a concentration of about 5E15 pieces/cm$^2$ at an energy of 4 keV. The term "5E15" as used herein means $5 \times 10^{15}$. The impurities of ions of indium are ion-implanted in a concentration of about 5E15 pieces/cm$^2$ at an energy of 50 keV.

In this step, the non-doped silicon film 6a exists in a region adjacent to the insulating film 5. In a region above the non-doped silicon film 6a, the doped silicon film 6b is formed. As shown in FIG. 9, the thus-formed state is as follows: the laminated film (multilayer silicon film) including the silicon film 6 is formed over the surface (sides and upper surface) of the control gate electrode CG via the insulating film 5 while the lower film of the laminated film is the non-doped silicon film 6a and the upper film of the laminated film is the doped silicon film 6b.

The region into which the p-type impurities are implanted is formed in a depth of, for example, 20 to 50 nm from the surface of the non-doped silicon film 6a. In other words, the thickness t2 of the doped silicon film 6b is set to about 20 to 50 nm. As a result, a non-doped polycrystal silicon film remains as the non-doped silicon film 6a over the insulating film 5 in a thickness t1 of about 10 to 30 nm (see FIG. 9).

The relationship between the thicknesses t1 and t2 is preferably as follows: t1<t2. The implantation region (in the depth t2) of the p-type impurities can be adjusted by controlling the implantation conditions, the implantation energy of impurity ions, the concentration of impurity ions implanted (amount of implantation, or amount of dose), or the like.

In forming the non-doped silicon film 6a, an amorphous silicon film may be formed and then subjected to a heat treatment to be polycrystallized. The implantation region (in a depth t2) of the p-type impurities is preferably formed in the predetermined thickness in the last step, taking into consideration not only the above implantation conditions, but also the heat diffusion of impurity ions due to the following thermal load (in the heat treatment step).

Figure 10:
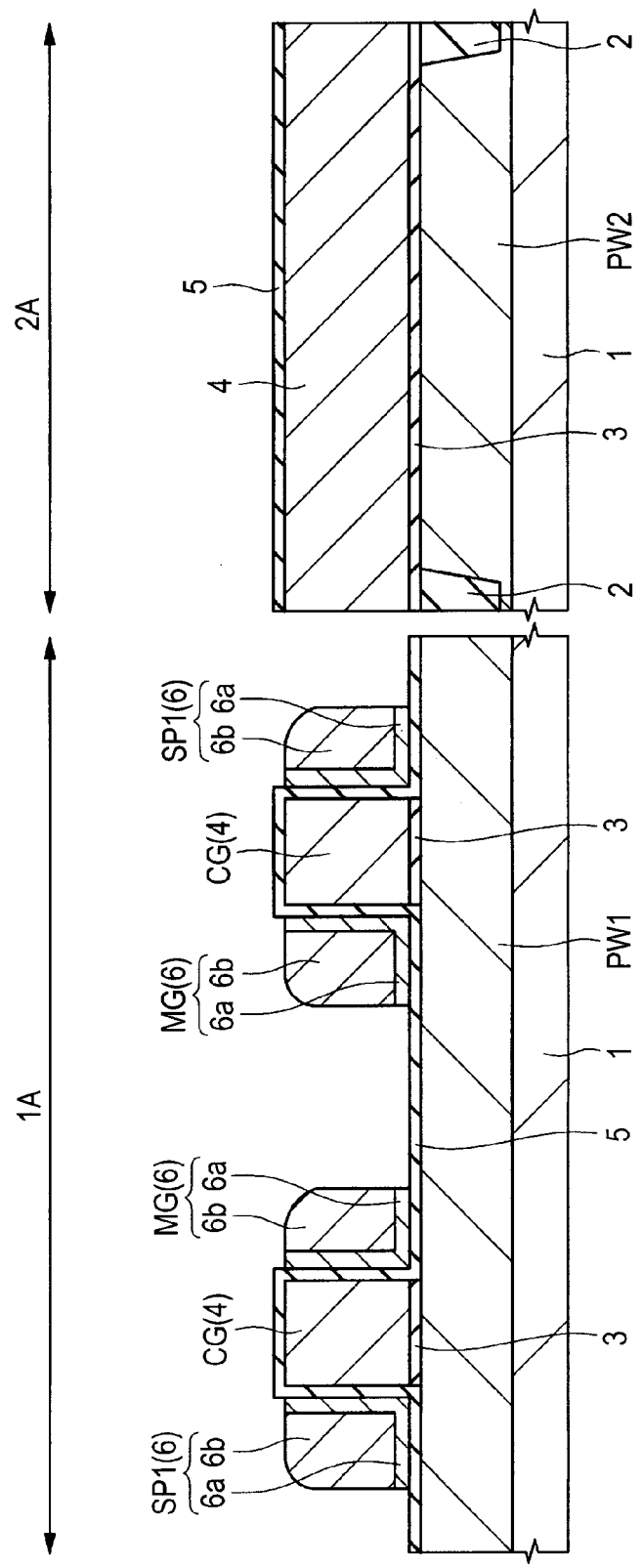
FIG. 10 is a cross-sectional view showing a main part of another manufacturing step of the semiconductor device in the first embodiment, following the step shown in FIG. 9.

Then, the silicon film 6 which is a laminated film of the non-doped silicon film 6a and the doped silicon film 6b is etched back (or selectively removed). In the etching back step, the silicon film 6 is removed by anisotropic etching by a predetermined thickness from its surface. In this step, as shown in FIG. 10, the silicon films 6 can remain at both sidewalls of the control gate electrode CG via the insulating film 5 in the form of sidewall spacer. The silicon film 6 (6a, 6b, sidewall film) remaining on one of both sidewalls of the control gate electrode CG forms the memory gate electrode MG. The silicon film 6 (6a, 6b, sidewall film) remaining on the other of both sidewalls of the control gate electrode CG forms the silicon spacer SP1. The memory gate electrode MG and the silicon spacer SP1 are formed on the sidewalls of the control gate electrode CG opposed to each other, and are substantially symmetric with respect to the control gate electrode CG.

The part of the insulating film 5 under the above memory gate electrode MG serves as a gate insulating film of the memory transistor. The length of the memory gate (gate length of the memory gate electrode MG) is determined by the thickness of deposited silicon film 6 (that is, the thickness of the films 6a and 6b). Thus, the memory gate length can be adjusted by controlling the thickness of the deposited silicon film 6 (that is, t1+t2).

Figure 11:
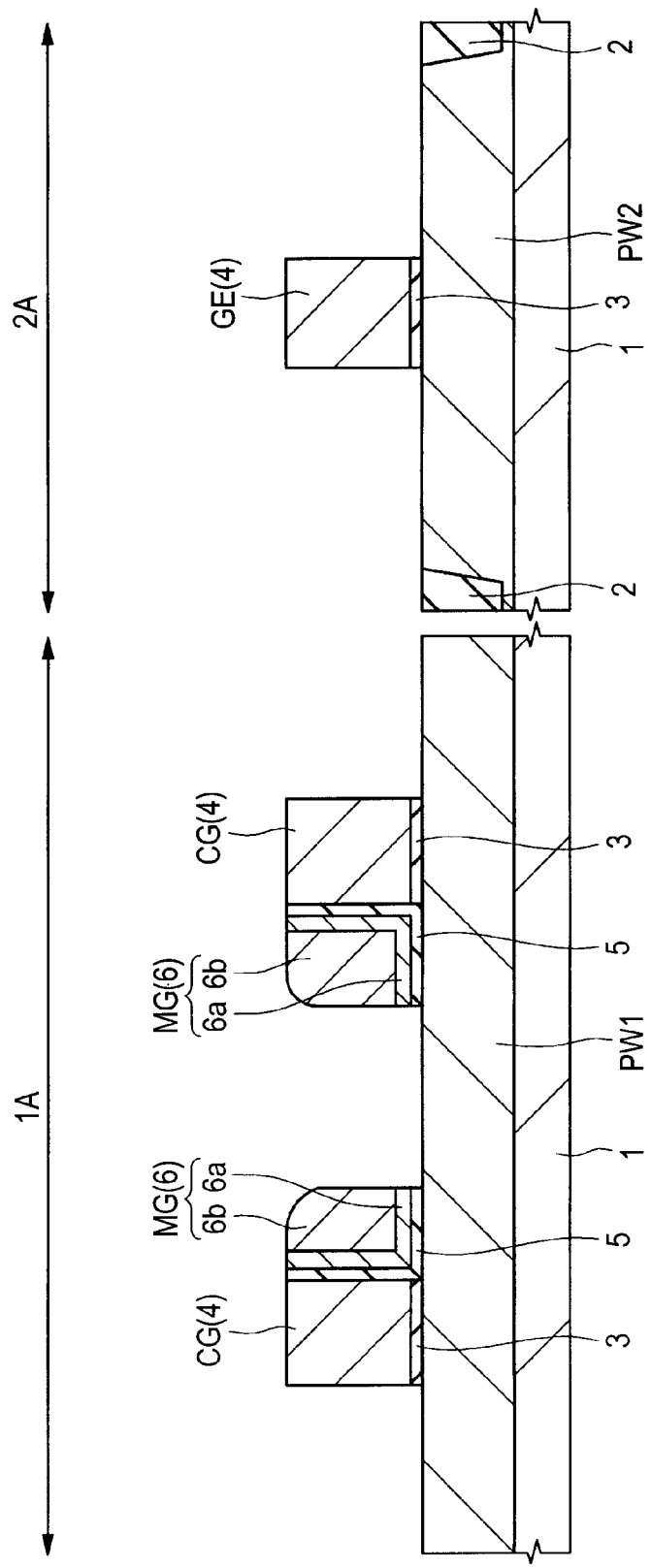
FIG. 11 is a cross-sectional view showing a main part of another manufacturing step of the semiconductor device in the first embodiment, following the step shown in FIG. 10.

Then, a photoresist film (not shown) is formed over the semiconductor substrate 1 so as to cover the memory gate electrode MG and to expose the silicon spacer SP1 by use of the photolithography. As shown in FIG. 11, the silicon spacer SP1 is removed by dry etching using the photoresist film as an etching mask. Thereafter, the photoresist film is removed by ashing or the like.

Subsequently, an exposed part of the insulating film 5 not covered with the memory gate electrode MG is removed by etching (for example, wet etching). At this time, in the peripheral circuit region 2A, the insulating film 5 is etched to expose the silicon film 4.

Then, a photoresist film (not shown) is formed in a region where the gate electrode GE of the n-channel MISFET Qn of the silicon film 4 is to be formed in the peripheral circuit region 2A by the photolithography, and the silicon film 4 is etched using the photoresist film as a mask. Thereafter, the part of the photoresist film is removed by ashing to form the gate electrode GE. The insulating film 3 remaining under the gate electrode GE is a gate insulating film of the n-channel MISFET Qn. The insulating film 3 except for the part thereof covered with the gate electrode GE may be removed at the time of formation of the above gate electrode GE, or in the following patterning step or the like.

Figure 12:
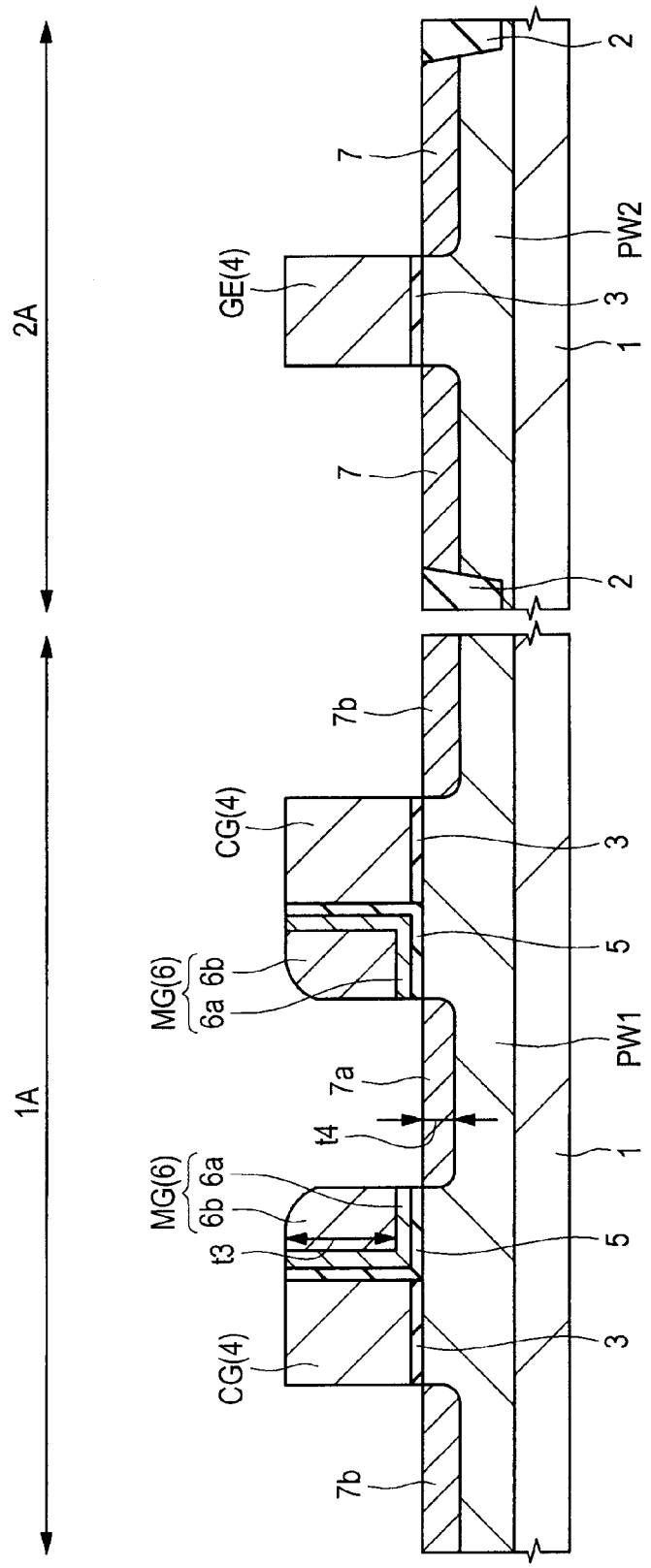
FIG. 12 is a cross-sectional view showing a main part of another manufacturing step of the semiconductor device in the first embodiment, following the step shown in FIG. 11.

Then, as shown in FIG. 12, an $n^-$-type semiconductor region $7b$ is formed by implanting n-type impurities, such as arsenic (As) or phosphorus (P), into the semiconductor substrate 1 (p-type well PW1) on the control gate electrode CG side in the memory cell region 1A. Further, n-type impurities, such as arsenic (As) or phosphorus (P), are implanted into the semiconductor substrate 1 (p-type well PW1) between the adjacent memory gate electrodes MG to form an $n^-$-type semiconductor region $7a$. At this time, the $n^-$-type semiconductor region $7a$ is formed at the sidewall of the memory gate electrode MG (sidewall on one side opposite to the other side adjacent to the control gate electrode CG via the insulating film 5) in a self-alignment manner, and the $n^-$-type semiconductor region $7b$ is formed at the sidewall of the control gate electrode CG (sidewall on one side opposite to the other side adjacent to the memory gate electrode MG via the insulating film 5) in a self-alignment manner. The $n^-$-type semiconductor region $7a$ and the $n^-$-type semiconductor region $7b$ may be formed in the same ion implantation step, but are formed in different ion implantation steps in this embodiment. In this way, by formation of the regions $7a$ and $7b$ in the different ion implantation steps, the $n^-$-type semiconductor region $7a$ and the $n^-$-type semiconductor region $7b$ can be formed in a desired concentration of impurities and in a desired junction depth. In contrast, when implanting impurities in the different ion implantation steps, a photoresist film (not shown) is preferably formed in one of the $n^-$-type semiconductor region $7a$ and the $n^-$-type semiconductor region $7b$ where the implantation is not performed. When the $n^-$-type semiconductor region $7a$ is formed in alignment with the memory gate electrode MG in the different ion implantation step, the region where the photoresist film is preferably formed is at least the $n^-$-type semiconductor region $7b$. Since p-type impurities are introduced as impurities into the silicon film 6 for forming the memory gate electrode MG as described above in this embodiment, the photoresist film is desirably formed to cover the memory gate electrode MG such that the p-type impurities in the doped silicon film $6b$ forming the memory gate electrode MG compensates for or chancels the n-type impurities implanted in formation of the $n^-$-type semiconductor region $7a$. However, it is often difficult to form the photoresist film just covering the memory gate electrode MG because of the accuracy of the photolithography. In that case, a part of the memory gate electrode MG is not covered with the photoresist film, and parts of the n-type impurities for forming the $n^-$-type semiconductor region $7a$ are implanted into the memory gate electrode MG, and thus compensate for the p-type impurities of the doped silicon film $6b$ forming the memory gate electrode MG. Also, in this case, <1> the concentration of the p-type impurities in the doped silicon film $6b$ forming the memory gate electrode MG is sufficiently high as compared to the concentration of impurities in the $n^-$-type semiconductor region $7a$. <2> As shown in FIG. 12, the depth t4 of junction of the $n^-$-type semiconductor region $7a$ is smaller than the height t3 of the doped silicon film $6b$ of the memory gate electrode MG. Because of the above reasons <1> and <2>, the above state hardly affects the characteristics of the memory cell MC formed in this embodiment.

In the peripheral circuit region 2A, the $n^-$-type semiconductor region 7 is formed by implanting n-type impurities, such as arsenic (As) or phosphorus (P), into parts of the semiconductor substrate 1 on both sides of the gate electrode GE (p-type well PW2). At this time, the $n^-$-type semiconductor region 7 is formed on each sidewall of the gate electrode GE in a self-alignment manner.

Figure 13:
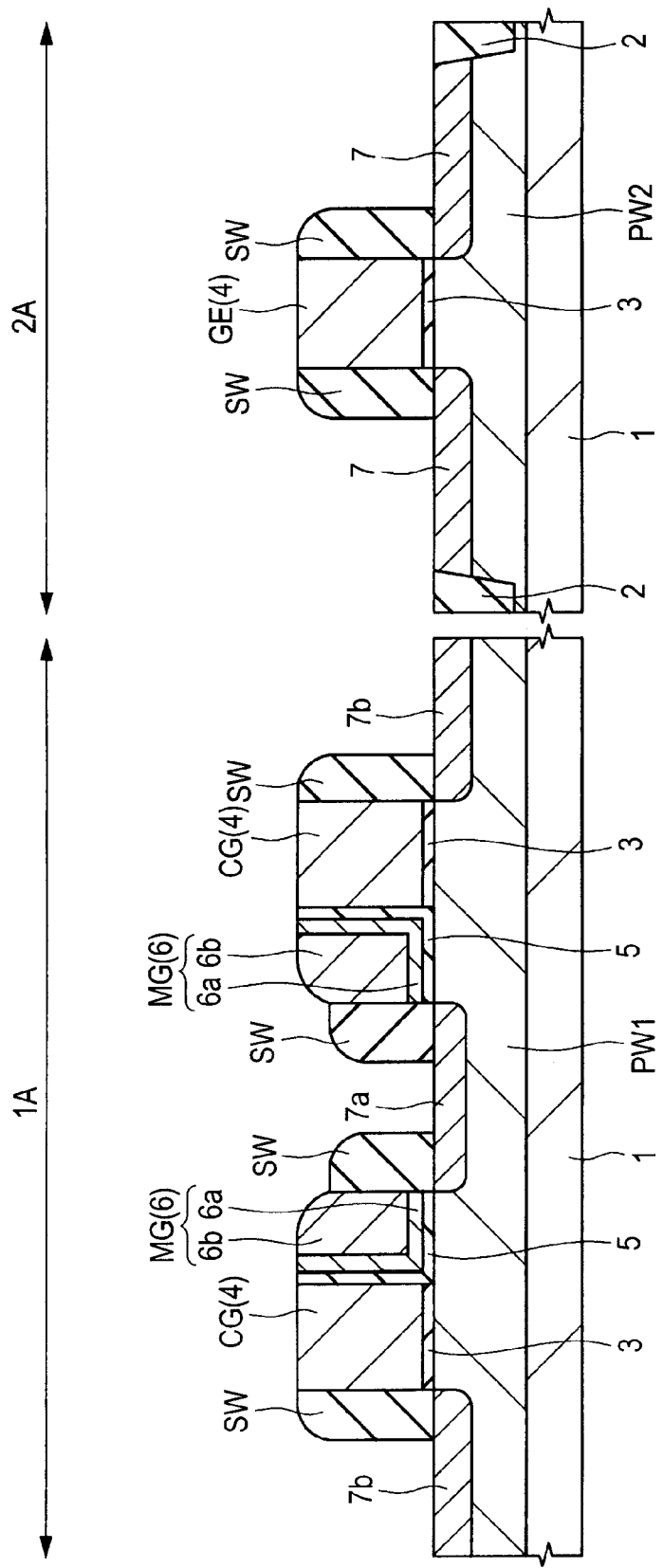
FIG. 13 is a cross-sectional view showing a main part of another manufacturing step of the semiconductor device in the first embodiment, following the step shown in FIG. 12.

Then, as shown in FIG. 13, in the memory cell region 1A, a sidewall insulating film SW is formed of an insulating film, such as a silicon oxide film, a silicon nitride film, or a lamination of the silicon oxide film and the silicon nitride film, at each sidewall of a combination pattern of the memory gate electrode MG and the control gate electrode CG. In the peripheral circuit region 2A, the sidewall insulating films SW are formed at the sidewalls of the gate electrode GE. For example, the sidewall insulating film SW is formed on each sidewall of the combination pattern (CG and MG) and the sidewalls of the gate electrode GE by depositing the insulating film, such as the silicon oxide film, over the entire main surface of the semiconductor substrate 1, and then by etching back the insulating film.

Then, as shown in FIG. 14, in the memory cell region 1A, a photoresist film PR1 is formed so as to cover at least the $n^-$-type semiconductor region $7a$ exposed from between the sidewall insulating films SW and the memory gate electrodes MG on both sides of the region $7a$. In order to implant n-type impurities in the following step, it is necessary to cover a region (not shown) for forming a p-channel MISFET in the peripheral circuit region 2A with a photoresist film. When the above photoresist film PR1 is maintained at the time of forming the photoresist film, a formation step of an additional photoresist film (exposure mask) is not necessary.

Then, an $n^+$-type semiconductor region $8b$ having a high impurity concentration is formed by implanting n-type impurities, such as arsenic (As) or phosphorus (P), into the semiconductor substrate 1 (p-type well PW1) using the photoresist film (mask film) PR1, the control gate electrode CG, the memory electrode MG, and the sidewall insulating films SW as a mask. At this time, the $n^+$-type semiconductor region $8b$ is formed in a self-alignment with the sidewall insulating film SW on the control gate electrode CG side in the memory cell region 1A. The $n^+$-type semiconductor region $8b$ is formed as a semiconductor region having a high impurity concentration and a large junction depth as compared to each of the $n^-$-type semiconductor region $7a$ and the $n^-$-type semiconductor region $7b$. In the peripheral circuit region 2A, n-type impurities, such as arsenic (As) or phosphorus (P), are implanted into parts of the semiconductor substrate 1 (p-type well PW2) on both sides of the gate electrode GE to form the $n^+$-type semiconductor region 8. At this time, the $n^+$-type semiconductor region 8 is formed in a self-alignment with each of the sidewall insulating films SW on the sidewalls of the gate electrode GE in the peripheral circuit region 2A. Thus, the source and drain regions (7, 8) of the LDD structure are formed on both sides of the gate electrode GE in the peripheral circuit region 2A.

In the memory cell region 1A, the photoresist film PR1 is formed so as to cover the n⁻-type semiconductor region 7a and the memory gate electrodes MG on both sides thereof. Such a region, that is, the region of the semiconductor substrate 1 (p-type well PW1) positioned between the memory gate electrodes MG does not have any high concentration impurity region formed therein. Further, no n-type impurities are implanted into the memory gate electrode MG, so that the p-type impurities in the doped silicon film 6b forming the memory gate electrode MG are not balanced out (canceled)

In the above step, the n⁻-type semiconductor region 7b and the n⁺-type semiconductor region 8b having an impurity concentration higher than that of the region 7b form an n-type drain region MD serving as a drain region of the memory transistor. Only the n⁻-type semiconductor region 7a forms an n-type source region MS serving as a source region of the control transistor.

Then, heat treatment is performed so as to activate the impurities introduced into the source region MS (n⁻-type semiconductor region 7a), the drain region MD (n⁻-type semiconductor region 7b and n⁺-type semiconductor region 8b), and the source and drain regions (7 and 8).

In the above step, the memory cell MC of the nonvolatile memory is formed in the memory cell region 1A, and the n-channel type MISFET Qn is formed in the peripheral circuit region 2A (see FIG. 15).

Then, if necessary, the main surface of the semiconductor substrate 1 is cleaned, for example, by wet etching using a diluted hydrofluoric acid or the like. Thus; the upper surface of the n⁻-type semiconductor region 7a, the upper surface of the n⁺-type semiconductor region 8b, the upper surface of the control gate electrode CG, and the upper surface of the memory gate electrode MG are cleaned to remove unnecessary material, including a natural oxide film. The upper surface of the n⁺-type semiconductor region 8 and the upper surface of the gate electrode GE are cleaned to thereby remove unnecessary material, such as the natural oxide film.

Then, the metal silicide layer (metal silicide film) 11 is formed over each of the control gate electrode CG, the memory gate electrode MG, the n⁻-type semiconductor region 7a, and the n⁺-semiconductor region 8b using a salicide technique. The metal silicide layer 11 is formed over each of the gate electrode GE and the n⁺-type semiconductor region 8. The metal silicide layer 11 can reduce the resistance, such as a diffusion resistance or a contact resistance. The metal silicide layer 11 can be formed in the following way.

For example, a metal film (not shown) is formed over the entire main surface of the semiconductor substrate 1, and heat treatment is applied to the semiconductor substrate 1. As a result, the above metal film is reacted with the control gate electrode CG, the memory gate electrode MG, the gate electrode GE, and the upper layer parts of the n⁻-type semiconductor region 7a and the n⁺-type semiconductor regions 8 and 8b. Thus, the metal silicide layer 11 is formed over each of the control gate electrode CG, the memory gate electrode MG, the gate electrode GE, and the upper parts of the n⁻-type semiconductor region 7a and the n⁺-type semiconductor regions 8 and 8b. The metal film can be formed of, for example, a cobalt (Co) film or nickel (Ni) film, by sputtering or the like.

After removing an reacted part of the metal film, for example, a single film of a silicon oxide film, or a laminated film including a silicon nitride film and a silicon oxide film formed thereon more thickly than the silicon nitride film is formed as an insulating film (interlayer insulating film) 12 over the entire main surface of the semiconductor substrate 1, for example, by the CVD method or the like. After forming the insulating film 12, the upper surface of the insulating film 12 is planarized using a chemical mechanical polishing (CMP) method or the like, if necessary.

Then, the insulating film 12 is dry-etched to form contact holes (openings or through holes) in the insulating film 12. Then, a laminated film of a barrier conductive film 13a and a main conductive film 13b is formed in each contact hole. Thereafter, unnecessary parts of the main conductive film 13b and the barrier conductive film 13a over the insulating film 12 are removed by the CMP method or the etching back method to thereby form the plugs. PG. The plug PG is formed, for example, above the n⁺-type semiconductor regions 8 and 8b. Although not shown in the cross-sectional view of FIG. 1, some plugs PG are also formed, for example, over the n⁻-type semiconductor region 7a, the control gate electrode CG, the memory gate electrode MG, and the gate electrode GE. The barrier conductive film 13a can be formed, for example, using a titanium film, a titanium nitride film, or a laminated film thereof. The main conductive film 13b can be formed using a tungsten film or the like.

Then, a wiring (wiring layer) M1 is formed over the insulating film 12 with the plugs PG embedded therein, whereby the semiconductor device of this embodiment is formed as shown in FIGS. 1 and 2. The wiring M1 is formed, for example, by a Damascene technique (hereinafter referred to as a single damascene technique).

First, an insulating film (interlayer insulating film) 14 is formed over the insulating film 12 with the plugs PG embedded therein, and wiring trenches are formed in the insulating film 14 using the photolithography and dry etching techniques. Then, a barrier conductive film (not shown) is formed over the main surface of the semiconductor substrate 1 including therein the wiring trenches. Subsequently, a copper seed layer (not shown) is formed over the barrier conductive film by the CVD or sputtering method. Then, a cupper plating film is formed over the seed layer using electroplating or the like to fill the inside of each wiring trench therewith. Thereafter, the copper plating film, the seed layer, and the barrier metal film in regions except for the wiring trenches are removed by the CMP method to thereby form a first layer wiring M1 using copper as a main conductive material. The barrier conductive film can be formed, for example, using a titanium nitride film, a tantalum film, a tantalum nitride film, or the like.

Thereafter, a second or later wirings are formed by the dual damascene method or the like, but its illustration and description will be omitted below. The wiring M1 and an upper wiring above the wiring M1 can also be formed by patterning a conductive film for wiring, in addition to the above damascene technique. In this case, the conductive film can be formed, for example, using tungsten or aluminum.

In this way, this embodiment forms the memory gate electrode MG into which p-type impurities are introduced. Thus, the following effects will be obtained.

Figure 16A:
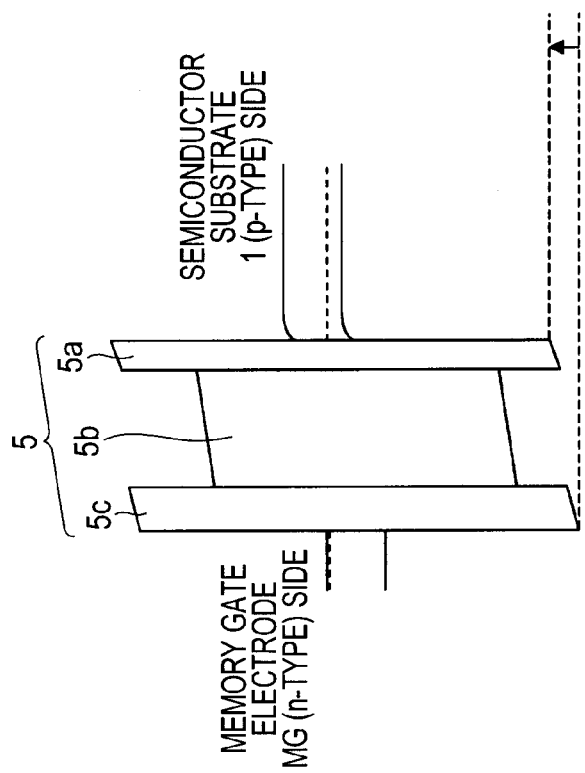
FIG. 16A is a band diagram when a memory gate electrode is a p-type gate electrode.
Figure 16B:
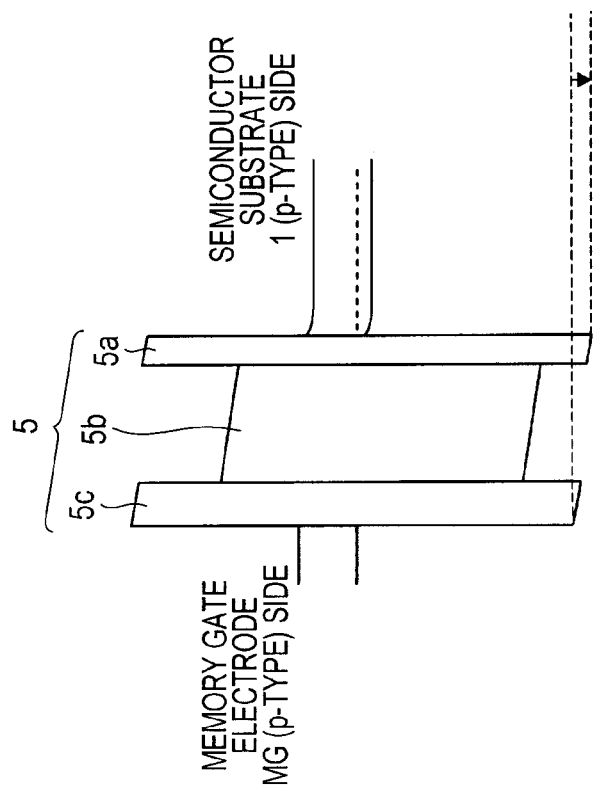
FIG. 16B is a band diagram when a memory gate electrode is an n-type gate electrode.

The memory gate electrode MG is formed as the p-type gate electrode into which p-type impurities are introduced, which improves the hole holding characteristics of the memory cell MC. FIG. 16A is a band diagram when the memory gate electrode MG is a p-type gate electrode and the semiconductor substrate 1 is of the p-type, like this embodiment. FIG. 16B is a band diagram when the memory gate electrode MG is an n-type gate electrode and the semiconductor substrate 1 is of the p-type. The arrow of the figure indicates the fact that an electric field from the memory gate electrode to the semiconductor substrate shown in FIG. 16A is weaker than that shown in FIG. 16B. As shown in FIG. 16A, the memory gate electrode MG is formed as the p-type gate electrode to release the electric field applied to the insulating film 5 as compared to the case of forming the memory gate electrode MG as the n-type gate electrode as shown in FIG. 16B, so that the electric field acts on holes in the direction of weakening the electric field in an erasing state. Thus, the holding characteristics of holes of the memory cell MC can be further improved. That is, the erasing state is preferably maintained to thereby improve the retention.

In particular, with the miniaturization of semiconductor devices, that is, with the miniaturization of a memory gate length, the holding characteristic of holes tends to be degraded as compared to the holding characteristic of electrons. In order to improve the retention characteristics, it is effective to make the p-type memory gate electrode MG, that is, to introduce p-type impurities into the memory gate electrode MG to improve the holding characteristics of holes.

In addition to the above effects, in the silicon film 6 forming the memory gate electrode MG of this embodiment, a part of the silicon film 6 located around a region adjacent to the insulating film 5 is formed of the non-doped silicon film 6a, and extends along the semiconductor substrate 1, which will provide the following effects.

That is, the lower part of the memory gate electrode MG in contact with the insulating film 5 is formed of the non-doped silicon film 6a to thereby improve the charge holding characteristics of the memory. This is because holes are apt to be generated in the region directly above the insulating film 5, that is, under the memory gate electrode MG, whereby the electric field is less likely to be applied to the charge storing layer (specifically, the silicon nitride film 5b) of the insulating film 5. This makes it difficult for the charges (electrons or holes) stored in the charge storing portion to escape therefrom, thus improving the charge holding characteristic. In other words, the electric field at the insulating film 5 (silicon nitride film 5b) is released, which makes it difficult for the charges to move from the charge storing layer to the memory gate electrode MG. Thus, the data holding characteristics of the nonvolatile memory can be improved.

In this way, the memory gate electrode is formed of the p-type gate electrode, and the region of the film 6 adjacent to the insulating film 5 is formed of the non-doped silicon film 6a to extend along the surface of the semiconductor substrate 1. Each feature has the above-mentioned independent effect. The combination of these features form the memory cell MC to improve the hole holding characteristics, which can further improve the retention characteristics.

P-type impurities are introduced into the upper layer part of the memory gate electrode MG by forming the memory cell MC as the combination of the above features (that is, the doped silicon film 6b containing the p-type impurities is formed at the upper layer part of the memory gate electrode MG), which can reduce the resistance of the memory gate electrode MG. Thus, the operating speed of the nonvolatile memory can be improved. The memory gate electrodes MG are formed in the form of long wiring (wiring for coupling the memory gate electrodes MG of the memory cells arranged in the direction of extension of the memory gate electrode MG). Thus, the resistance of the wiring itself can be decreased to improve the operating speed of the entire nonvolatile memory.

The source region (MS) of the memory transistor is comprised of only the n⁻-type semiconductor region 7a, whereby the memory gate electrode MG can be covered with the photoresist film PR1. Thus, n-type impurities are introduced into the memory gate electrode MG (doped silicon film 6b containing p-type impurities) in a high concentration, which can avoid an increase in resistance of the memory gate electrode MG.

In this embodiment, the non-doped silicon film 6a intervenes in between the doped silicon film 6b containing p-type impurities of the memory gate electrode MG and the control gate electrode CG, which can improve the breakdown voltage between the memory gate electrode MG and the control gate electrode CG, and thus can also improve the breakdown voltage of the memory cell MC.

When forming the n⁻-type semiconductor region 7a in the above step shown in FIG. 12, n-type impurities will be possibly introduced into an upper part of the memory gate electrode MG. In this embodiment, the p-type impurities are introduced into the silicon film 6 forming the memory gate electrode MG in order to form the memory gate electrode MG as the p-type gate electrode. For this reason, it is preferable to avoid introduction of n-type impurities into the memory gate electrode MG. However, even when it is difficult to avoid the introduction of n-type impurities into the memory gate electrode MG as described above, this embodiment will have the following effects.

In the step shown in FIG. 12, when the n-type impurities are introduced in the step of forming the n⁻-type semiconductor region 7a at the memory gate electrode MG with p-type impurities introduced thereinto, the region of the memory gate electrode MG into which the n-type impurities are introduced has substantially the same depth as the junction depth of the n⁻-type semiconductor region 7a. That is, n-type impurities are introduced into the region in a depth t4 from the upper surface of the memory gate electrode MG. In this case, the p-type impurities already introduced into the memory gate electrode are balanced out by the n-type impurities introduced into the memory gate electrode MG in formation of the n⁻-type semiconductor region 7a, so that the concentration of the p-type impurities becomes low at the upper part of the memory gate electrode MG. Thus, the region of the memory gate electrode MG into which the n-type impurities are introduced (region where the concentration of the p-type impurities becomes low) is easily depleted when applying a negative voltage to the memory gate electrode MG. In performing the erasing operation by the BTBT hot hole implantation erasing system, such a voltage applied to between the memory gate electrode MG and the control gate electrode CG is released. Thus, a leak current is less likely to flow therethrough between the memory gate electrode MG and the control gate electrode CG, whereby the electrical characteristics of the memory cell MC can be improved. The following embodiments can also exhibit such effects.

Accordingly, this embodiment can improve the characteristics of the semiconductor device having the nonvolatile memory. Further, the semiconductor device having the nonvolatile memory with better characteristics can be formed by a simple process.

For the purpose of improving data holding characteristics, the formation of a depletion layer over the insulating film 5 suppresses a phenomenon of data inversion caused by the transfer of the charges (electrons or holes) stored in the charge storing layer (namely, silicon nitride film 5b) to the memory gate electrode MG. From this viewpoint, the thickness t1 of the non-doped silicon film 6a in the region of the silicon film 6 forming the memory gate electrode MG adjacent to the insulating film 5 is more than 0. As a result, this embodiment exhibits the above effect. In order to obtain the certain effect described above, the thickness t1 of the non-doped silicon film 6a is preferably formed more thickly than the thickness of the silicon oxide film 5c of the insulating film 5. Taking into consideration the achievement of more sufficient effects, and the ease of manufacturing of the semiconductor device because of the possibility of diffusion of p-type impurities into the silicon film 6 by the heat treatment in the manufacturing step, the thickness (deposition thickness) t1 of the non-doped silicon film 6a is preferably 10 nm or more. From this point, the thickness (deposition thickness) t1 of the non-doped silicon film 6a formed in the above manufacturing step is 10 nm or more as described herein (note that the same goes for the following embodiments). In order to achieve the reduction in resistance of the memory gate electrode MG, the thickness (deposition thickness) t2 of the doped silicon film 6b is preferably 20 nm or more (that is, t2≥20 nm).

The memory gate length (gate length of the memory gate electrode MG) is determined by the total of the thickness t1 of the non-doped silicon film 6a and the thickness t2 of the doped silicon film 6b. The thickness t2 is preferably equal to or less than a half of the total thickness of the non-doped silicon film 6a and the doped silicon film 6b (that is, t1+t2).

Second Embodiment

Figure 17:
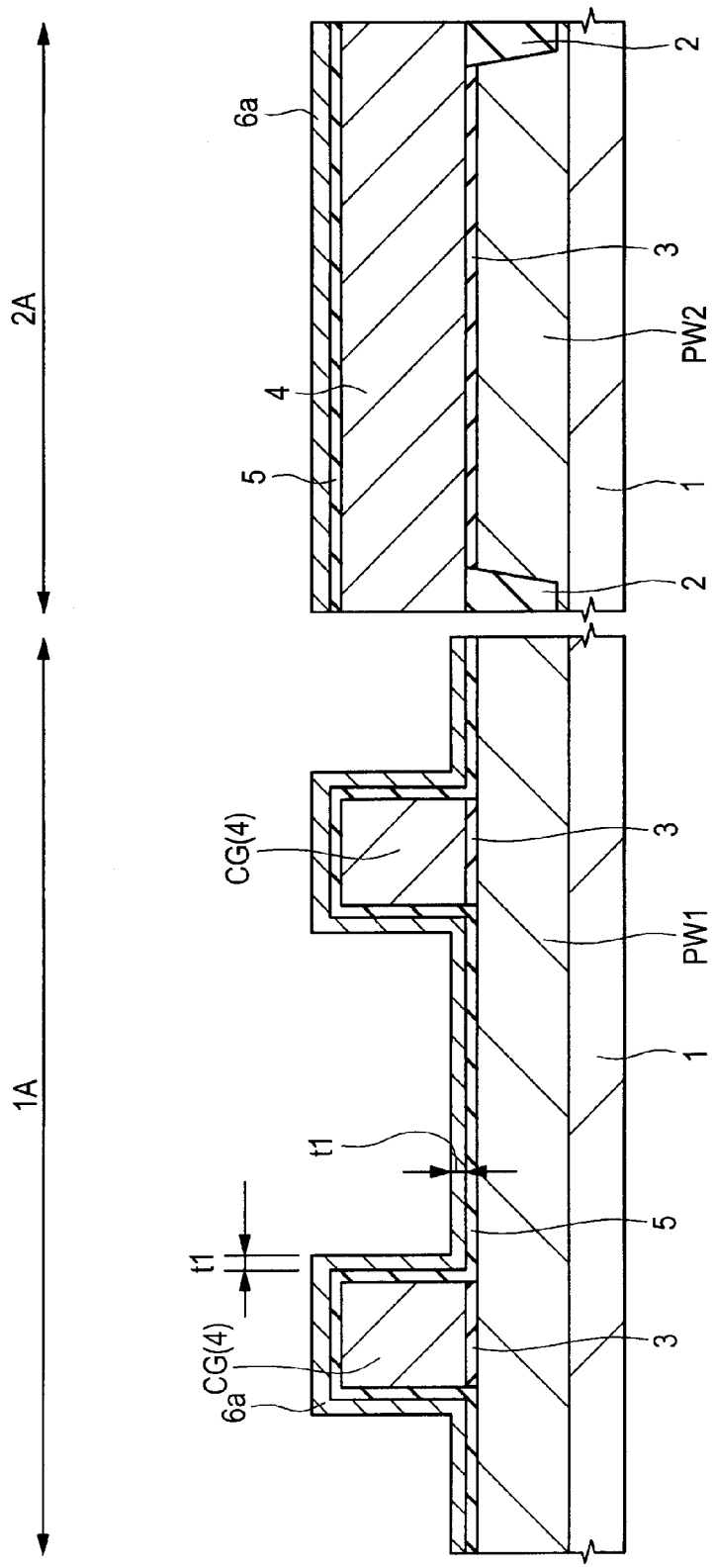
FIG. 17 is a cross-sectional view showing a main part of a manufacturing step of a semiconductor device according to a second embodiment.
Figure 18:
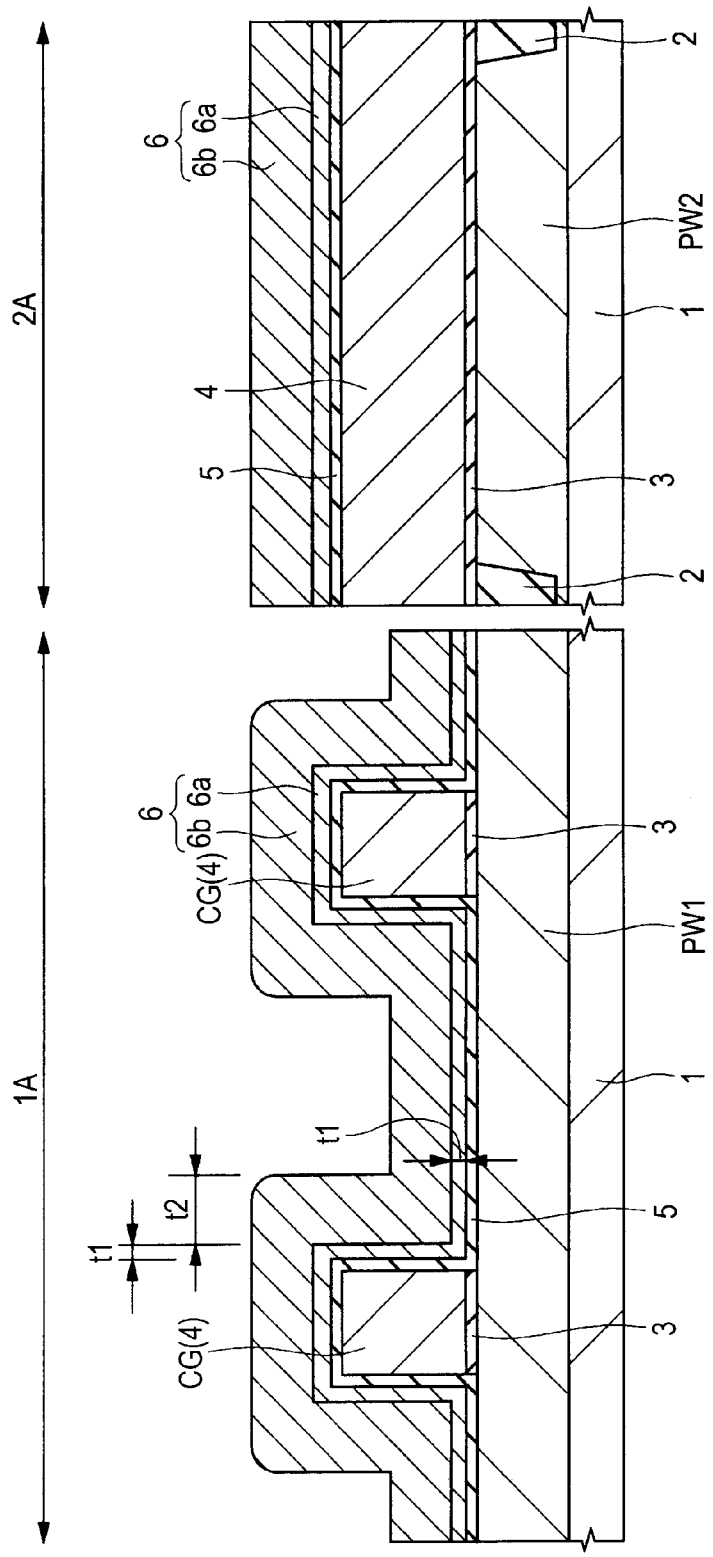
FIG. 18 is a cross-sectional view showing a main part of another manufacturing step of the semiconductor device in the second embodiment, following the step shown in FIG. 17.

In the first embodiment, when forming the memory gate electrode MG, p-type impurities are obliquely ion-implanted into the surface of the non-doped silicon film 6a to form a laminated film of the non-doped silicon film 6a and the doped silicon film 6b as the silicon film 6 forming the memory gate electrode MG (see FIG. 9). These films (6a and 6b) may be independently deposited. FIGS. 17 and 18 are cross-sectional views showing main parts of the manufacturing steps of the semiconductor device in this embodiment.

The structure of the semiconductor device of this embodiment has the same as that of the first embodiment, and thus a description thereof will be omitted below (see FIGS. 1 and 2 and the like). The manufacturing processes of the semiconductor device of this embodiment until the step of forming the insulating film 5 are the same as those of the first embodiment, and its detailed description thereof will be omitted below. That is, after forming the control gate electrode CG (see FIG. 6), the insulating film 5 is formed over the main surface of the semiconductor substrate 1 including the upper surface and sides of the control gate electrode CG in the same way as that of the first embodiment.

Then, as shown in FIG. 17, a non-doped (undoped) polycrystal silicon film is formed as the non-doped silicon film 6a over the insulating film 5 in a thickness t1 of about 10 to 30 nm by the CVD method or the like. That is, during the deposition, the polycrystal silicon film is deposited without containing p-type doping gas (gas for addition of p-type impurities) in a raw material gas. Then, as shown in FIG. 18, a polycrystal silicon film doped with p-type impurities (for example, boron (B), indium (In), or the like) is formed as the doped silicon film 6b in a thickness t2 of about 20 to 50 nm using the CVD method or the like. That is, the doped silicon film 6b is deposited in the raw material gas containing doping gas (gas for addition of impurities). The thickness t2 of the doped silicon film 6b is preferably more than the thickness t1 of the non-doped silicon film 6a (that is, t1<t2). In depositing the non-doped silicon film 6a and the doped silicon film 6b, an amorphous silicon film is formed and subjected to the heat treatment to be polycrystallized.

The concentration of impurities of the doped silicon film 6b is higher than that of the non-doped silicon film 6a, and the resistivity (specific resistance) of the doped silicon film 6b is lower than that of the non-doped silicon film 6a.

In the above step, the laminated film 6 comprised of the non-doped silicon film 6a and the doped silicon film 6b is formed over the surface (sides and upper surface) of the control gate electrode CG via the insulating film 5 (see FIG. 18). Then, the laminated film 6 of the non-doped silicon film 6a and the doped silicon film 6b is etched back to form the memory gate electrode MG or the like. The following steps after the forming step of the above laminated film 6 are the same as those of the first embodiment, and a detailed description thereof will be omitted below (see FIGS. 9 to 15, and FIGS. 1 and 2).

In this way, this embodiment can also form the semiconductor device having the same structure as that of the first embodiment, and thus exhibits the same effects as those of the first embodiment. Further, this embodiment facilitates the control of the thickness of the non-doped silicon film 6a and the doped silicon film 6b. Also, this embodiment facilitates the control of the impurity concentration of the doped silicon film 6b.

In the above first and second embodiments, FIGS. 1 and 18 illustrate a boundary between the non-doped silicon film 6a and the doped silicon film 6b containing p-type impurities. The impurities form a concentration profile, which makes it difficult to clearly represent the boundary. The non-doped silicon film 6a has an impurity concentration of the order of n×E17/cm$^3$ (n: 1 to 10) or less, and preferably, n×E16/cm$^3$ (n: 1 to 10) or less.

Thus, a small amount of p-type impurities may be contained in the non-doped silicon film 6a. Also, in this case, the effects equivalent to those of the above first and second embodiments can also be obtained. The small amount of p-type impurities can be generated due to the diffusion from the doped silicon film 6b, for example.

A small amount of n-type impurities may be contained in the non-doped silicon film 6a in advance so as to compensate for p-type impurities diffused from the doped silicon film 6b. In such a step, the following third embodiment will be described below.

Third Embodiments

Figure 19:
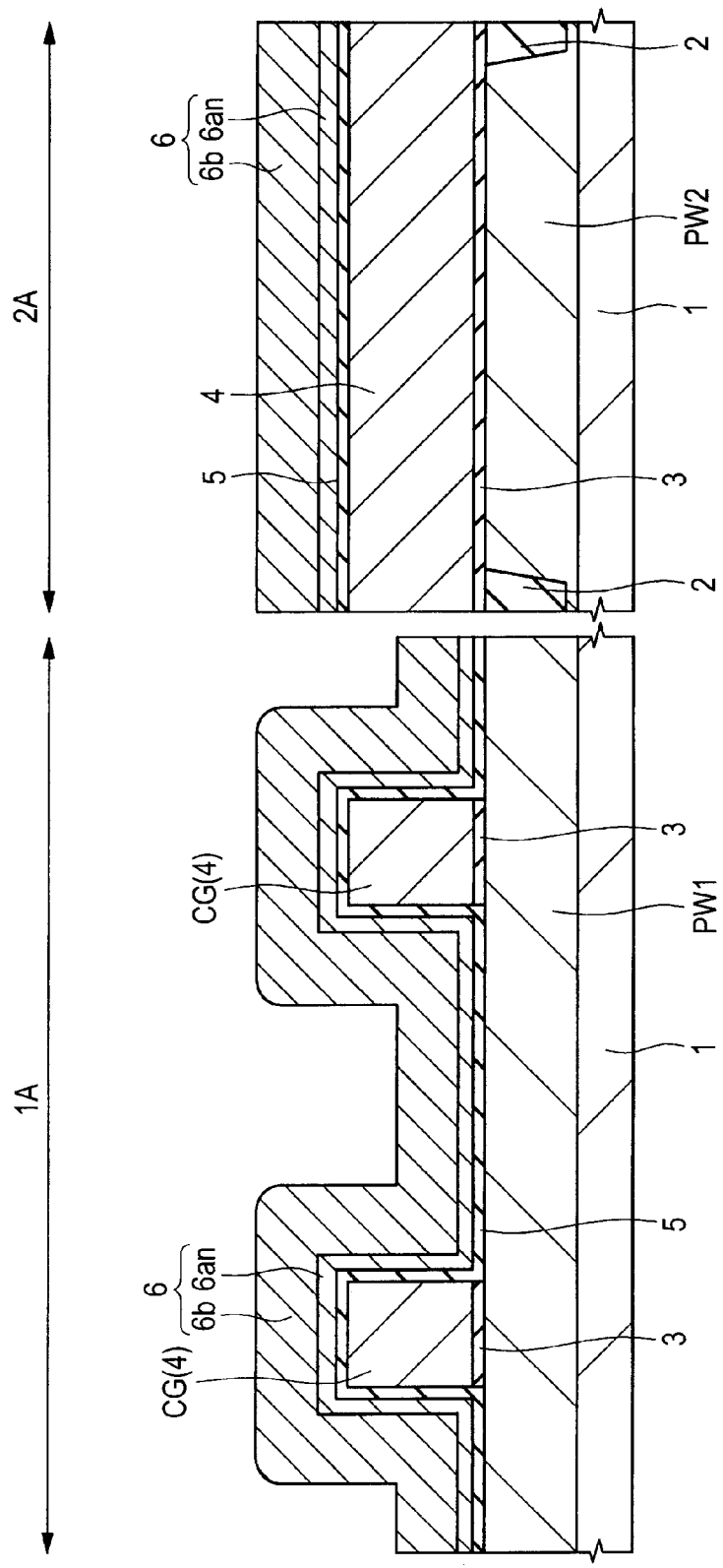
FIG. 19 is a cross-sectional view showing a main part of a manufacturing step of a semiconductor device according to a third embodiment.

In the first embodiment, the non-doped silicon film 6a is formed. Instead of this, a silicon film 6an containing a small amount of n-type impurities may be formed. FIG. 19 is a cross-sectional view showing a main part of a manufacturing step of the semiconductor device in this embodiment.

The structure of the semiconductor device of this embodiment has the same as that of the first embodiment except that the non-doped silicon film 6a of the memory gate electrode MG of the first embodiment is changed to the silicon film 6an containing a small amount of n-type impurities in this embodiment, and thus a description thereof will be omitted below (see FIGS. 1 and 2).

The manufacturing processes of the semiconductor device of this embodiment until the step of forming the insulating film 5 are the same as those of the first embodiment, and its detailed description thereof will be omitted below. That is, after forming the control gate electrode CG (see FIG. 6), the insulating film 5 is formed over the main surface of the semiconductor substrate 1 including the upper surface and sides of the control gate electrode CG, in the same way as the first embodiment.

Then, as shown in FIG. 19, the silicon film 6an containing a small amount of n-type impurities is formed over the insulating film 5 in a thickness t1 of about 10 to 30 nm by the CVD method or the like. For example, the polycrystal silicon film is deposited in the raw material gas containing a small volume of n-type doping gas (gas for addition of n-type impurities). Then, the polycrystal silicon film into which p-type impurities (for example, boron (B) or indium (In)) are implanted is formed as the doped silicon film 6b in a thickness t2 of about 20 to 50 nm using the CVD method or the like. That is, during deposition of the doped silicon film 6b, the doped silicon film 6b is deposited in the raw material gas containing p-type doping gas (gas for addition of p-type impurities). The concentration of n-type impurities of the silicon film 6an is preferably equal to or less than the order of n×E16/cm$^3$ (n: 1 to 10). The thickness t2 of the doped silicon film 6b is preferably more than the thickness t1 of the silicon film 6an (that is, t1<t2). When depositing the silicon film 6an and the doped silicon film 6b, an amorphous silicon film may be formed, and subjected to the heat treatment to be polycrystallized.

In the above step, the laminated film (silicon film) 6 comprised of the silicon film 6an containing a small amount of n-type impurities and the doped silicon film 6b is formed over the surface (sides and upper surface) of the control gate electrode CG via the insulating film 5. Then, the laminated film (silicon film) 6 comprised of the non-doped silicon film 6a and the doped silicon film 6b is etched back to form the memory gate electrode MG or the like. The following steps after forming the above laminated film (silicon film) 6 are the same as those of the first embodiment, and thus a detailed description thereof will be omitted below (see FIGS. 9 to 15 and FIGS. 1 and 2).

In this way, this embodiment has the effects equivalent to those of the first embodiment. In this embodiment, even when p-type impurities in the doped silicon film 6b are diffused into the lower silicon film 6an due to some causes (for example, thermal load in the following steps or the like) in the memory gate electrode MG, the diffused p-type impurities are balanced off by the small amount of n-type impurities contained in the silicon film 6an. Even when the p-type impurities are diffused into the silicon film 6an, an electric field relaxation effect of the memory gate electrode MG described in the first embodiment or the like can be maintained.

Now, the contents described in the first to third embodiments, and the concentration of impurities of the lower layer silicon film (6a, 6an) forming the memory gate electrode MG will be collectively described below.

As described in the first embodiment, the lower layer silicon film (6a) forming the memory gate electrode MG is desirably intrinsic, but a small amount of p-type impurities may be contained as described in the second embodiment. As described in the third embodiment, a small amount of n-type impurities may be contained. The above expressions "small amount of p-type or n-type impurities" as used herein means at least the concentration of impurities lower than that of the doped silicon film 6b, preferably, the order of the n×E16/cm$^3$ (n: 1 to 10).

Fourth Embodiment

Although in the first embodiment, the p-type impurities are obliquely ion-implanted into the surface of the non-doped silicon film 6a to form the doped silicon film 6b (see FIGS. 8 and 9), the p-type impurities may be vertically ion-implanted. FIGS. 20 to 23 are cross-sectional views showing main parts of the manufacturing steps of the semiconductor device in this embodiment. FIG. 24 is a partial enlarged cross-sectional view showing an enlarged part of FIG. 23.

The structure of the semiconductor device in this embodiment is the same as that of the first embodiment except for the structure of the memory gate electrode MG. The structure of the memory gate electrode MG will be described below.

Figure 23:
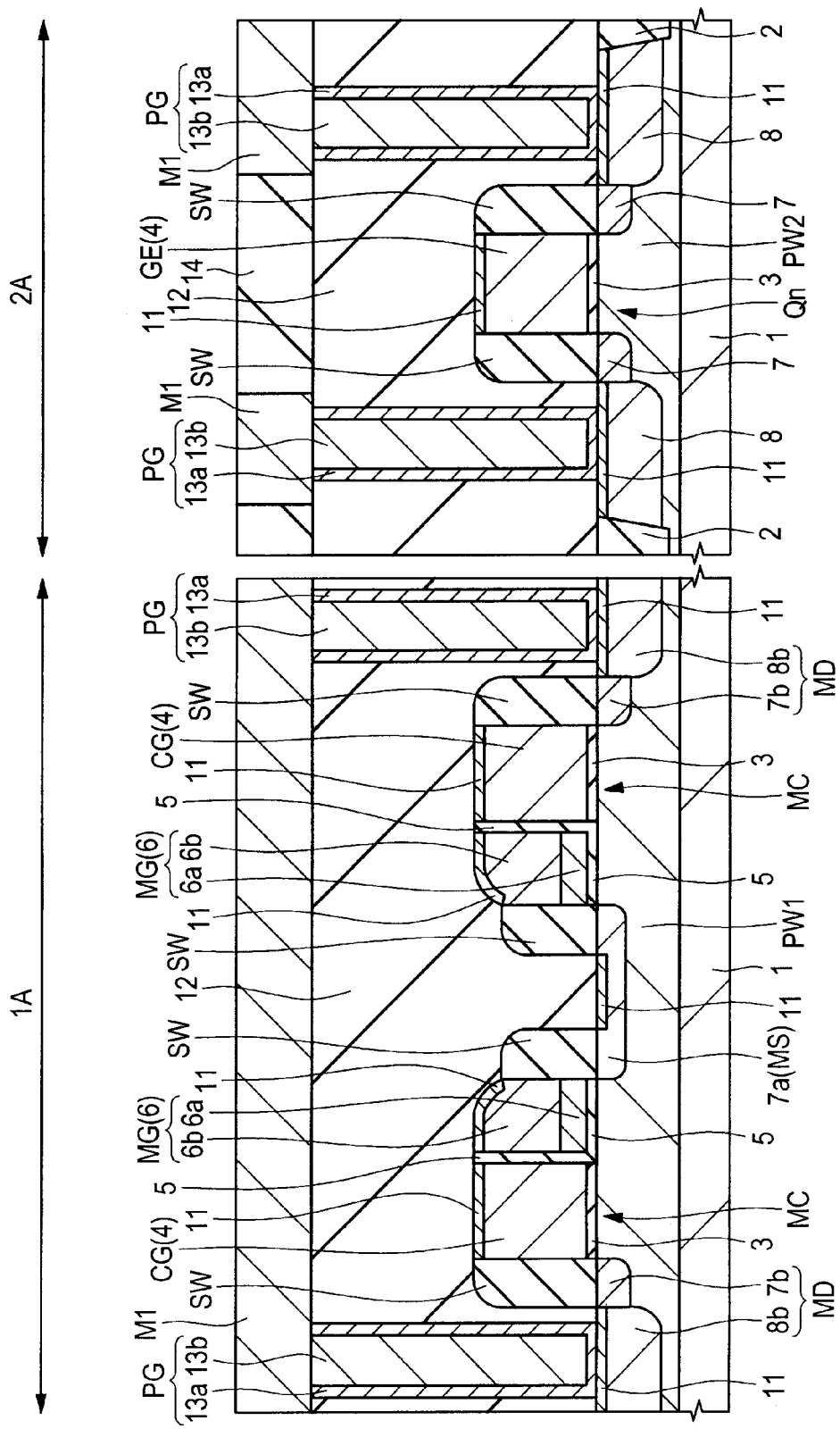
FIG. 23 is a cross-sectional view showing a main part of another manufacturing step of the semiconductor device in the fourth embodiment, following the step shown in FIG. 22.
Figure 24:
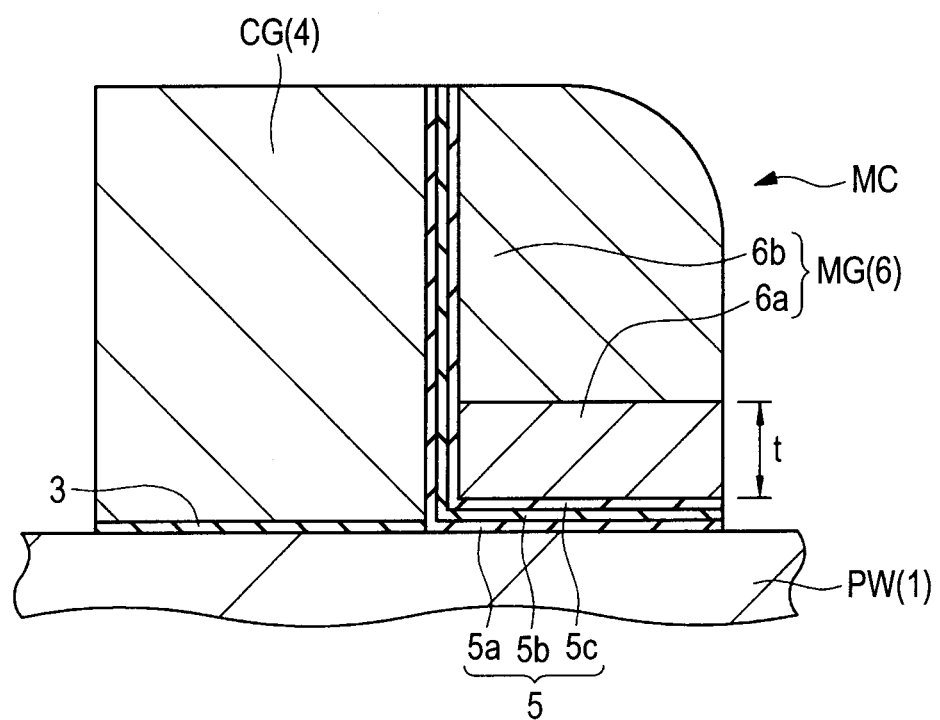
FIG. 24 is a partial enlarged cross-sectional view showing an enlarged part of FIG. 22.

The memory gate electrode MG is formed of the silicon film 6 as shown in FIGS. 23 and 24 which are the cross-sectional views of the last step in the description of this embodiment. The part of the silicon film 6 located around the region adjacent to the insulating film 5 is formed of the non-doped silicon film 6a, and the region extends along the surface of the semiconductor substrate 1. The doped silicon film 6b into which p-type impurities are introduced is formed over the non-doped silicon film 6a. In other words, the silicon film 6 is a lamination of the non-doped silicon film 6a and the doped silicon film 6b. The non-doped silicon film 6a is formed as a lower layer, and the doped silicon film 6b is formed as an upper layer. The non-doped silicon film 6a is formed of a silicon film which is non-doped (undoped), and the doped silicon film 6b is formed of a silicon film into which p-type impurities are introduced (doped). The p-type impurities include, for example, boron (B), indium (In), and the like.

Thus, the concentration of impurities of the doped silicon film 6b is higher than that of the non-doped silicon film 6a, and the resistivity (specific resistance) of the doped silicon film 6b is lower than that of the non-doped silicon film 6a.

As described above, the non-doped silicon film 6a is the lower layer, and the doped silicon film 6b is the upper layer. That is, the non-doped silicon film 6a is positioned over the insulating film 5 in contact with the insulating film 5, and the doped silicon film 6b is positioned over the non-doped silicon film 6a. This embodiment differs from the first embodiment (see FIG. 2) in that the non-doped silicon film 6a does not intervene in between the doped silicon film 6b and the control gate electrode CG (see FIG. 24). That is, the non-doped silicon film 6a is positioned in parallel to the surface of the semiconductor substrate 1. That is, the non-doped silicon film 6a has a horizontal portion formed horizontally, and does not have a vertical portion positioned substantially vertically to the surface of the substrate 1, unlike the first embodiment (see FIG. 2). The insulating film 5 has a horizontal portion positioned in parallel to the surface of the semiconductor substrate 1, that is, horizontally formed, and a vertical portion positioned substantially vertically to the surface of the substrate 1.

The manufacturing processes of the semiconductor device in this embodiment until the step of forming the insulating film 5 are the same as those of the first embodiment, and its detailed description thereof will be omitted below. That is, after forming the control gate CG (see FIG. 6), like the first embodiment, the insulating film 5 is formed over the main surface of the semiconductor substrate 1 including the upper surface and sides of the control gate electrode CG.

Then, a non-doped (undoped) polycrystal silicon film is formed as the non-doped silicon film 6a over the insulating film 5 in a thickness of about 30 to 70 nm by the CVD method or the like. That is, during the deposition process, the polycrystal silicon film is deposited without containing doping gas (gas for addition of impurities) in a raw material gas (see FIG. 7). In forming the non-doped silicon film 6a, an amorphous silicon film is formed and then subjected to a heat treatment to be polycrystallized.

Figure 20:
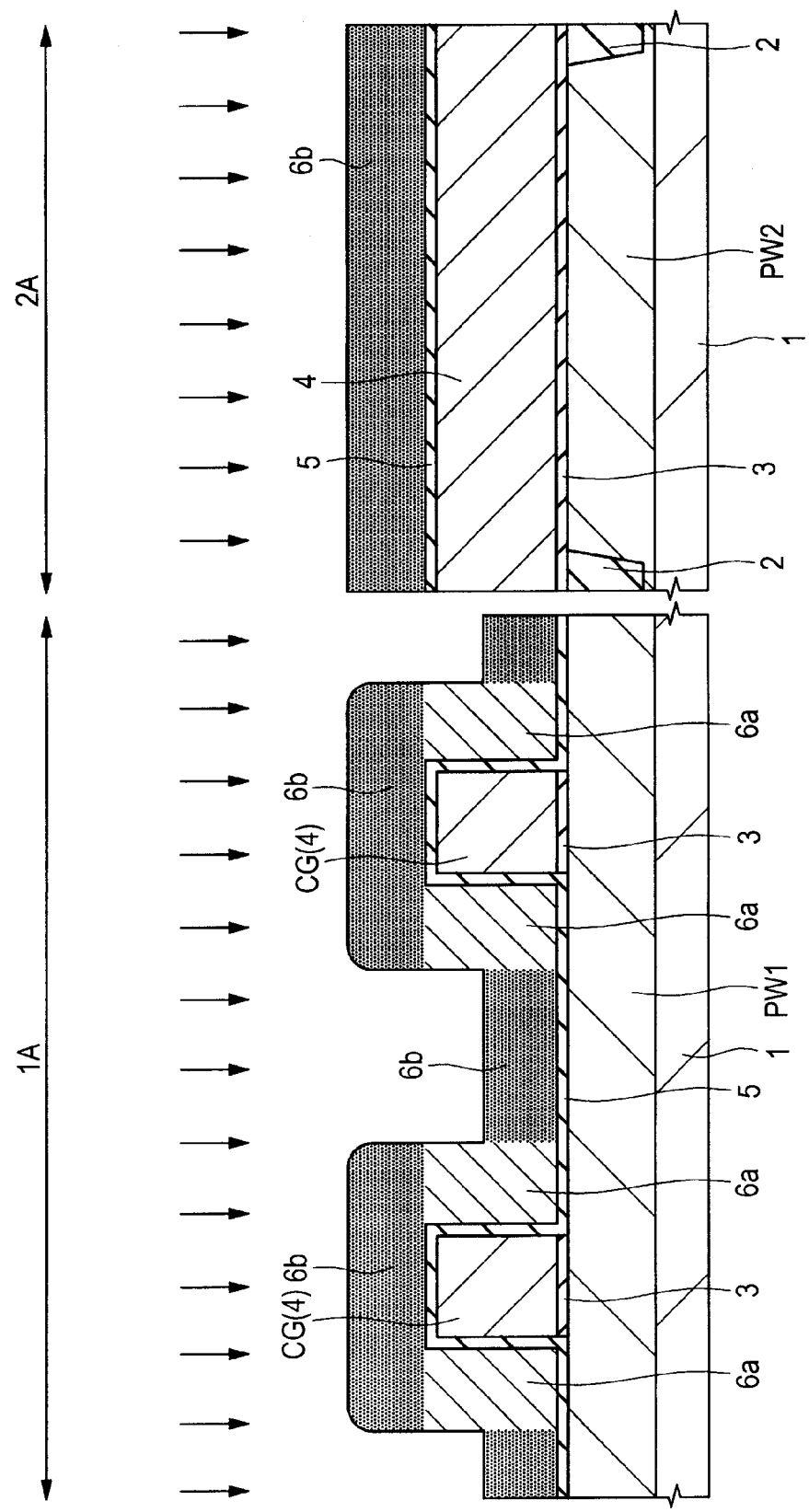
FIG. 20 is a cross-sectional view showing a main part of a manufacturing step of a semiconductor device according to a fourth embodiment.

Then, as shown in FIG. 20, p-type impurities (for example, such as boron (B) or indium (In)) are ion-implanted substantially vertically to the surface of the non-doped silicon film 6a. That is, p-type impurities are implanted into the semiconductor substrate 1 substantially vertically, specifically, at an angle θ of about 0° to 5°. The impurities of boron are implanted, for example, at an energy of 4 keV in a concentration of about 5E15 pieces/cm$^2$. The term "5E15" as used herein represents 5×10$^{15}$. The impurities of indium are implanted, for example, at an energy of 50 keV in a concentration of about 5E15 pieces/cm$^2$.

The vertical ion-implantation does not implant p-type impurities into the surface of the non-doped silicon film 6a corresponding to the sides of the control gate electrode CG. However, the vertical ion-implantation implants the p-type impurities into a flat part, that is, parts of the non-doped silicon film 6a positioned above the surface of the control gate electrode CG, above the sidewalls of the control gate electrode CG in connection with the above-mentioned surface, and above the insulating film 5 in a predetermined depth (of about 30 to 70 nm) from the surface of the non-doped silicon film 6a.

Figure 21:
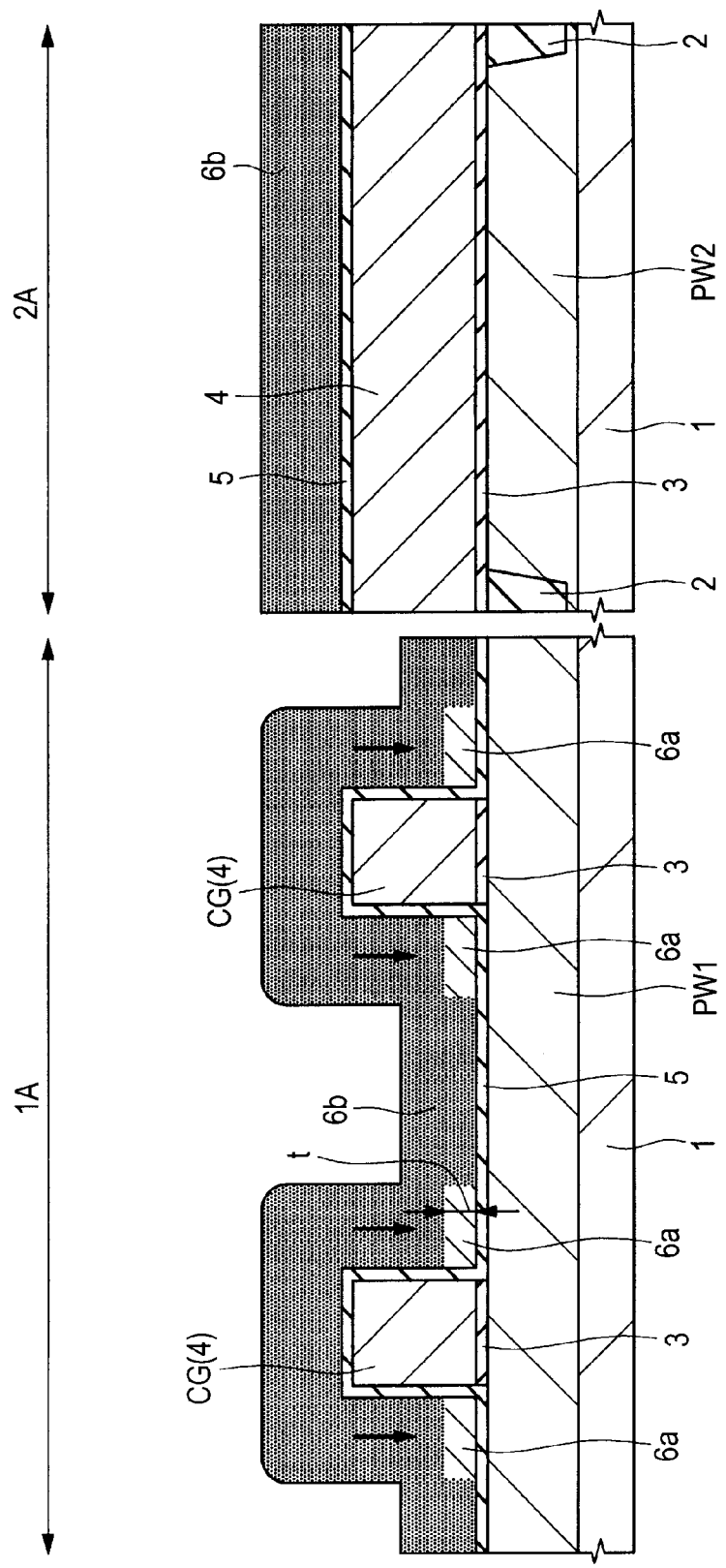
FIG. 21 is a cross-sectional view showing a main part of another manufacturing step of the semiconductor device in the fourth embodiment, following the step shown in FIG. 20.

Then, as shown in FIG. 21, the heat treatment is applied to diffuse the p-type impurities into the parts of the non-doped silicon film 6a positioned over the sidewalls of each control gate electrode CG. At this time, the conditions for the heat treatment are adjusted such that the p-type impurities are diffused into the non-doped silicon film 6a positioned at the sidewalls of the control gate electrode CG up to the position in a thickness t from the bottom (surface of the insulating film 5) of the silicon film 6a. In other words, the p-type impurities are diffused into the non-doped silicon film 6a positioned on the sidewalls of the control gate electrode CG such that the region not containing any impurities remain in a thickness t from the bottom of the film 6a. The thickness t is preferably in a range of about 10 to 30 nm.

That is, in the non-doped silicon film 6a corresponding to the sidewall of the control gate electrode CG, the non-doped silicon film 6a remains in the thickness t from the bottom (surface of the insulating film 5) thereof. And, the region which is located above the silicon film 6a having the depth t becomes a doped silicon film 6b. Other parts of the non-doped silicon film 6a except for some parts of the silicon film 6a positioned at the sides of the control gate electrode CG also become the doped silicon films 6b (see FIG. 21).

The concentration of impurities of the doped silicon film 6b is higher than that of the non-doped silicon film 6a, and the resistivity (specific resistance) of the doped silicon film 6b is lower than that of the non-doped silicon film 6a.

Figure 22:
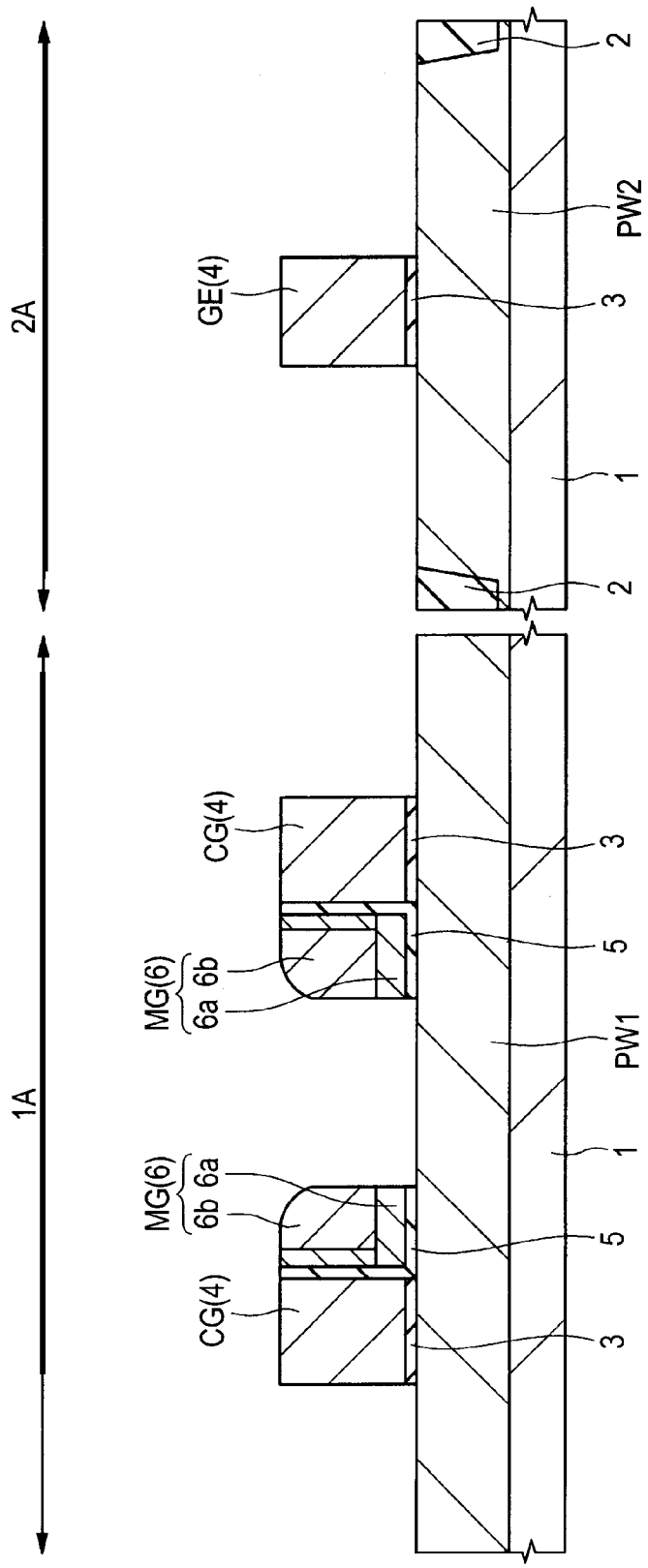
FIG. 22 is a cross-sectional view showing a main part of another manufacturing step of the semiconductor device in the fourth embodiment, following the step shown in FIG. 21.

Thereafter, like the first embodiment, the non-doped silicon film 6a and the doped silicon film 6b are etched back to form the memory gate electrode MG and the silicon spacer (SP1), and then to remove the silicon spacer SP1 as shown in FIG. 22. The gate electrode GE is formed in the peripheral circuit region 2A.

The following steps are the same as those of the first embodiment, and thus a description thereof will be omitted below (see FIGS. 12 to 14).

In the above step, the semiconductor device shown in FIGS. 23 and 24 is formed.

In this way, this embodiment includes the memory gate electrode MG formed of a lamination of the non-doped silicon film 6a and the doped silicon film 6b containing p-type impurities, and thus exhibits the following effects.

The memory gate electrode MG is formed as the p-type gate electrode containing p-type impurities, and thus acts on holes in the direction of lowering the electric field to thereby improve the hole holding characteristics of the memory cell MC. That is, the erasing state is maintained well to improve the retention.

The lower part of the memory gate electrode MG in connection with the insulating film 5 is comprised of the non-doped silicon film 6a to improve the charge holding characteristics of the memory. That is, holes are likely to be generated at the lower layer of the memory gate electrode MG, which makes it difficult for an electric field to be applied. Thus, the charges (electrons or holes) stored in the charge storing portion are less likely to be released, and the charge holding characteristics are improved. In particular, when the upper layer includes the doped silicon film 6b containing p-type impurities, the electric field corresponding to the holes is further released to improve the holding characteristics of the holes. That is, the state of erasing is maintained well, which improves the retention.

The upper layer part of the memory gate electrode MG is comprised of the doped silicon film 6b containing the p-type impurities to thereby reduce the resistance of the memory gate electrode MG. Thus, the operating speed of the nonvolatile memory can be improved. The memory gate electrodes MG are formed in the form of long wiring (wiring for coupling the memory gate electrodes MG of the memory cells arranged in the direction of extension of the memory gate electrode MG). This can reduce the resistance of the wiring itself, and thus can improve the operating speed of the entire nonvolatile memory.

Further, the source region (MS) of the memory transistor is comprised of only the $n^-$-type semiconductor region 7a. Likewise the first embodiment, the memory gate electrode MG can be covered with the photoresist film PR1 in the step of forming the $n^+$-type semiconductor region 8b having a high impurity concentration in the step shown in FIG. 14. The n-type impurities are introduced into the memory gate electrode MG (doped silicon film 6b containing p-type impurities) in a concentration higher than that of the $n^-$-type semiconductor region 7a, which can avoid an increase in resistance of the memory gate electrode MG.

Unlike the first embodiment, in this embodiment, the non-doped silicon film 6a does not intervene in between the control gate electrode CG and the doped silicon film 6b containing p-type impurities of the memory gate electrode MG. That is, since the vertical portion included in the non-doped silicon film 6a of the first embodiment does not exist, the writing characteristic is improved. In other words, the amount of charges introduced into the charge storing portion is increased at the time of writing. Even when the writing voltage is decreased, a desired amount of charges can be introduced.

In this way, this embodiment can improve the characteristics of the semiconductor device including the nonvolatile memory. Further, the semiconductor device having the nonvolatile memory with better characteristics can be formed by a simple process.

For the purpose of improving data holding characteristics, this embodiment suppresses a phenomenon of data inversion caused by the transfer of the charges (electrons or holes) stored in the charge storing layer (namely, silicon nitride film 5b) to the memory gate electrode MG. From this viewpoint, the thickness t of the non-doped silicon film 6a in the region of the silicon film 6 forming the memory gate electrode MG adjacent to the insulating film 5 is more than 0. As a result, this embodiment exhibits the above effect. In order to obtain the certain effect described above, the thickness t of the non-doped silicon film 6a is preferably formed more thickly than the thickness of the silicon oxide film 5c of the insulating film 5. Taking into consideration the achievement of more sufficient effects, and the ease of manufacturing of the semiconductor device because of the possibility of diffusion of p-type impurities into the silicon film 6 by the heat treatment in the manufacturing step, the thickness t of the non-doped silicon film 6a is preferably 10 nm or more. From this viewpoint, the thickness (deposition thickness) t of the non-doped silicon film 6a formed in the manufacturing step is described as 10 nm or more.

The thickness t is preferably half or more of the memory gate length (gate length of the memory gate electrode MG).

The non-doped silicon film 6a of this embodiment is also desirably intrinsic, but a small amount of p-type impurities may be contained as described in the second embodiment. As described in the third embodiment, a small amount of n-type impurities may be contained.

Fifth Embodiment

Although in the first embodiment, the n-type source region MS serving as the source region of the control transistor is comprised of only the n⁻-type semiconductor region 7a, polycrystal silicon film 22 containing n-type impurities may be formed over the n⁻-type semiconductor region 7a. FIGS. 25 to 29 are cross-sectional views showing main parts of manufacturing steps of the semiconductor device in this embodiment.

The semiconductor device structure of this embodiment is the same as that of the first embodiment except for the polycrystal silicon film 22 over the n⁻-type semiconductor region 7a and the metal silicide layer 11 thereover, and thus the structure of a region in the vicinity of the n⁻-type semiconductor region 7a will be described below.

Figure 29:
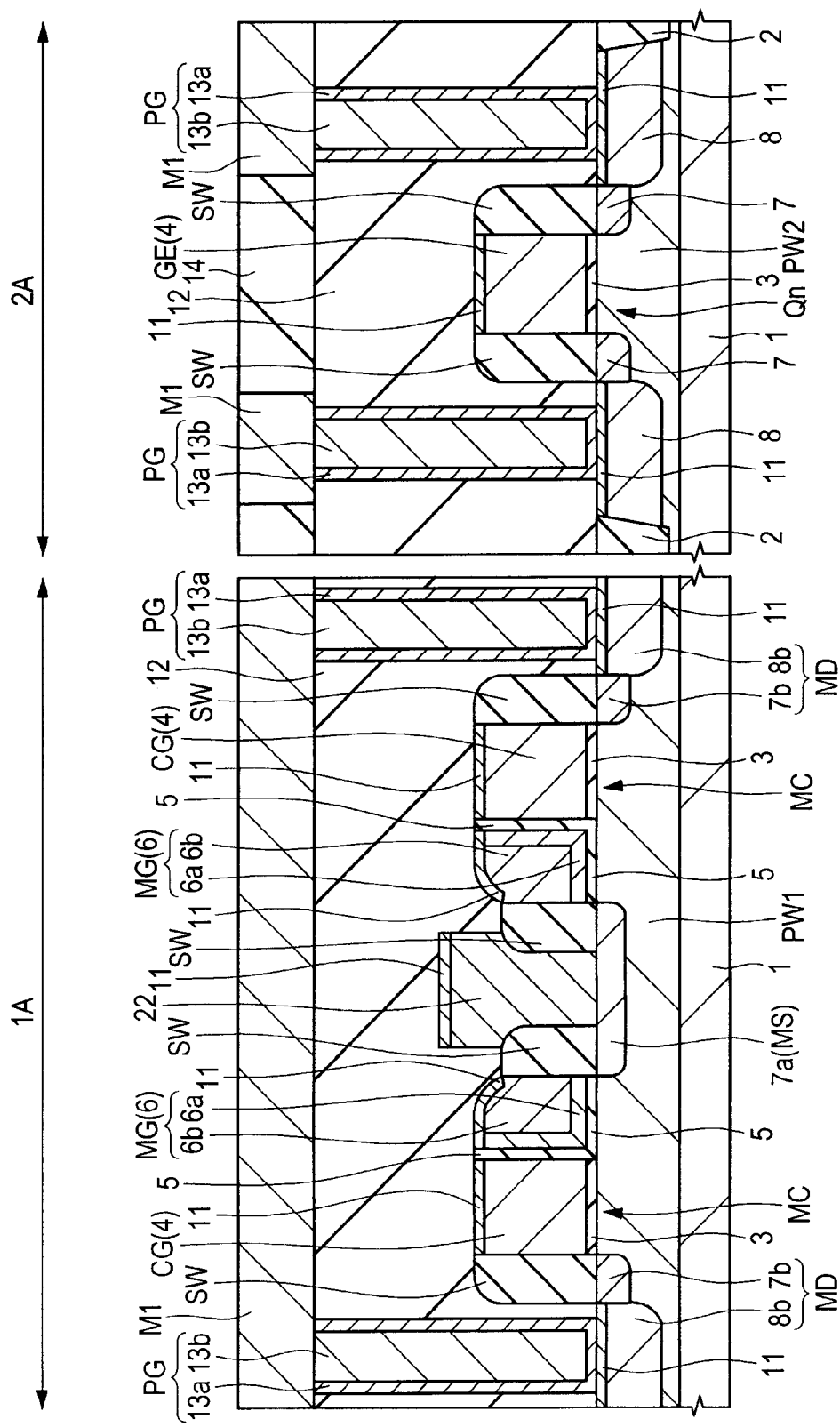
FIG. 29 is a cross-sectional view showing a main part of another manufacturing step of the semiconductor device in the fifth embodiment, following the step shown in FIG. 28.

As shown in FIG. 29 which is the cross-sectional view of the last step in the description of this embodiment, the semiconductor device of this embodiment includes the n⁻-type semiconductor region 7a disposed in the semiconductor substrate 1 (p-type well PW1) between the memory gate electrodes MG. The polycrystal silicon film 22 is disposed between the sidewall insulating films SW over the n⁻-type semiconductor region 7a. Further, the metal silicide layer 11 is disposed over the polycrystal silicon film 22. That is, in the first embodiment, the metal silicide layer 11 is disposed on the type semiconductor region 7a (see FIG. 15), whereas in this embodiment, the metal silicide layer 11 is disposed not on the n⁻-type semiconductor region 7a, but on the polycrystal silicon film 22.

The manufacturing processes of the semiconductor device of this embodiment until the step of forming the sidewall insulating film SW are the same as those of the first embodiment, and its detailed description thereof will be omitted below. That is, after forming the n⁻-type semiconductor region (impurity diffusion layer) 7a by implanting n-type impurities into the semiconductor substrate 1 (p-type well PW1) between the adjacent memory gate electrodes MG (see FIG. 12), the sidewall insulating films SW are formed on sidewalls of a combination pattern of the control gate electrode CG and the memory gate electrode MG (see FIG. 13). The sidewall insulating film SW is formed over each sidewall of the gate electrode GE in the peripheral circuit region 2A.

Figure 25:
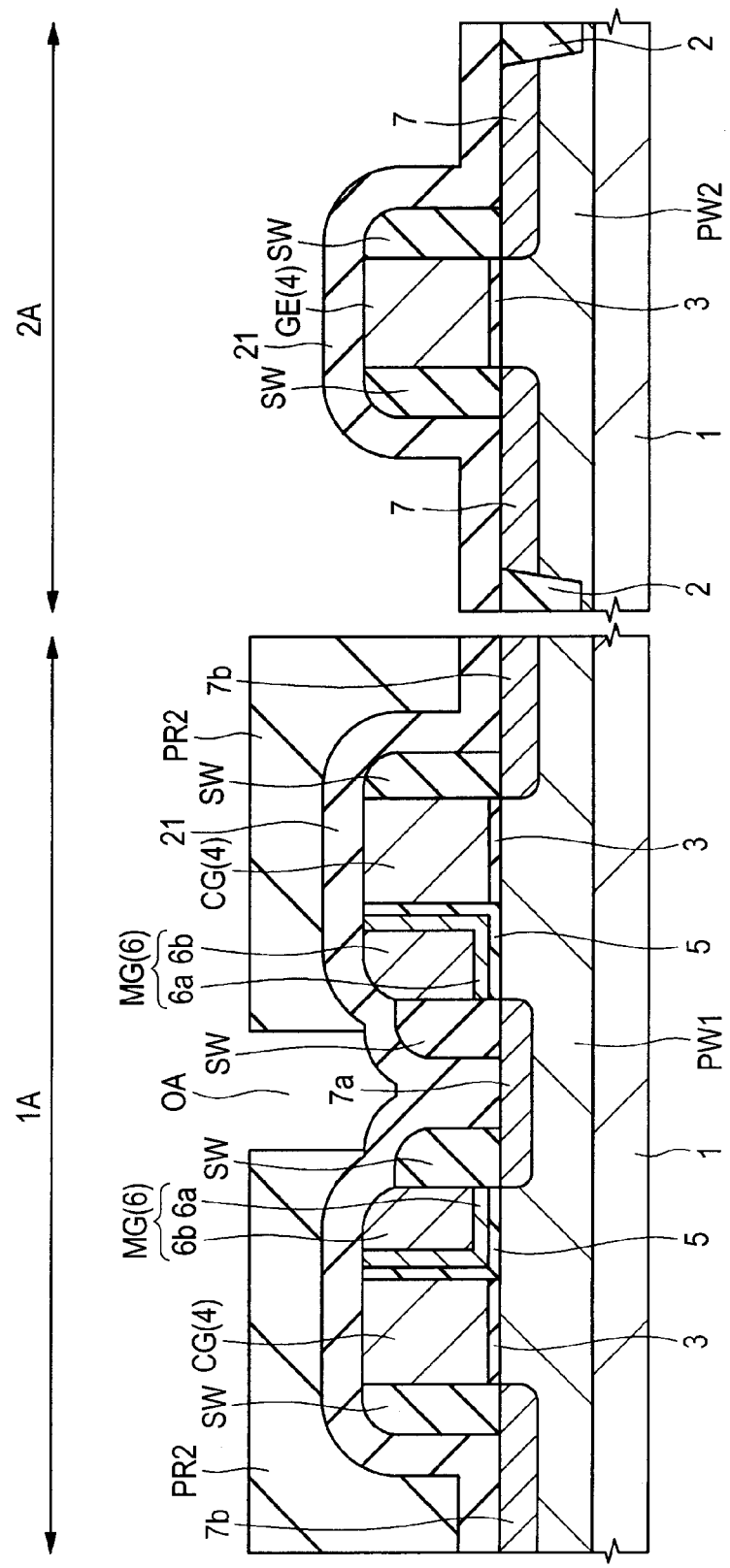
FIG. 25 is a cross-sectional view showing a main part of a manufacturing step of a semiconductor device according to a fifth embodiment.

Then, as shown in FIG. 25, for example, a silicon oxide film is formed as a protective film 21 over the entire main surface of the semiconductor substrate 1 by the CVD method or the like. Subsequently, a photoresist film PR2 having an opening OA above the n⁻-type semiconductor region 7a is formed using the photolithography.

Then, the protective film 21 is etched using the photoresist film PR2 as a mask. The etching allows the n⁻-type semiconductor region 7a between the memory gate electrodes MG (sidewall insulating films SW) to be exposed. Thereafter, the photoresist film PR2 is removed by ashing or the like.

Figure 26:
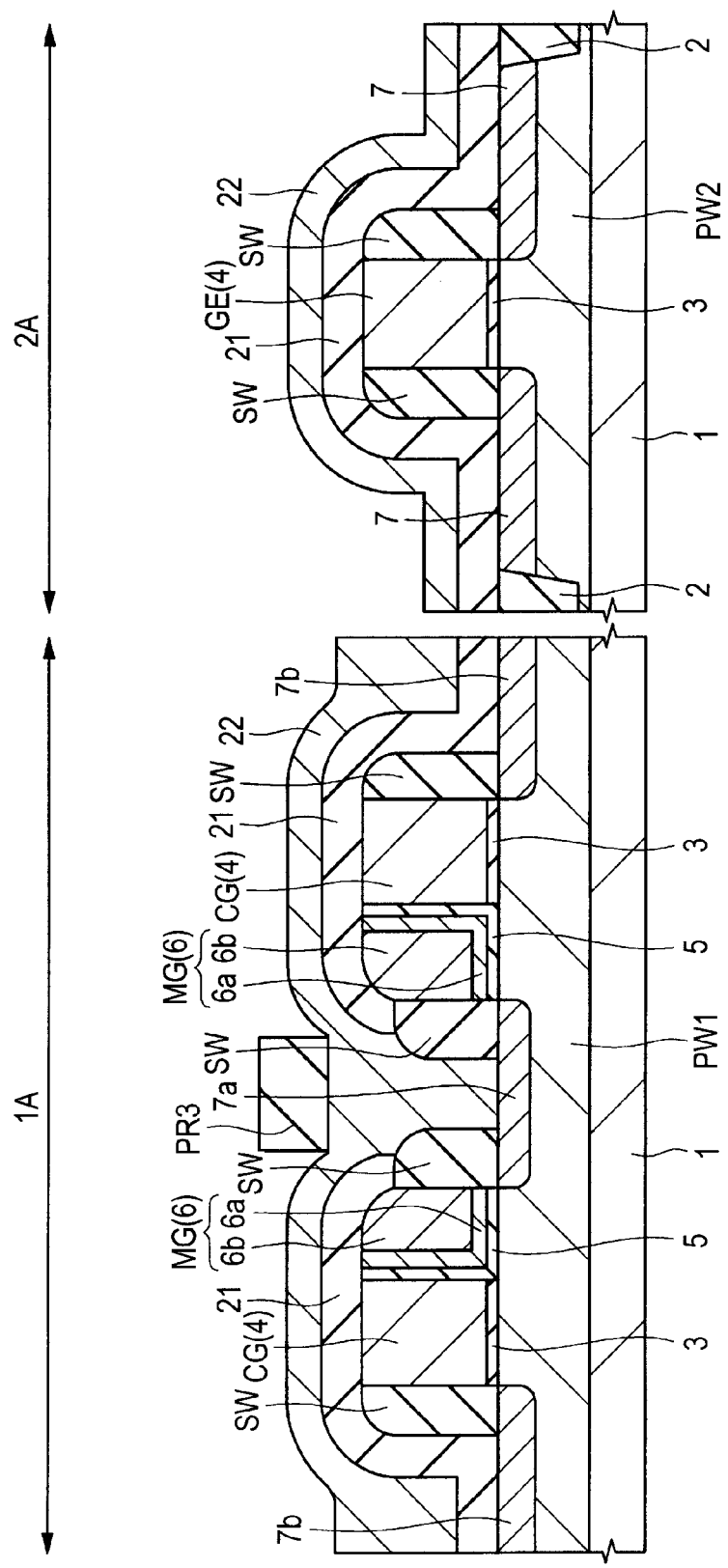
FIG. 26 is a cross-sectional view showing a main part of another manufacturing step of the semiconductor device in the fifth embodiment, following the step shown in FIG. 25.

Thereafter, as shown in FIG. 26, a polycrystal silicon film 22 containing n-type impurities is formed over the entire main surface of the semiconductor substrate 1. The polycrystal silicon film 22 is formed in such a thickness as to fill a gap between the memory gate electrodes MG (sidewall insulating films SW) using the CVD method or the like. That is, during the deposition process, the polycrystal film 22 is deposited in the above thickness in the raw material gas containing n-type doping gas (gas for addition of n-type impurities). The non-doped polycrystal silicon film may be deposited and the n-type impurities may be contained therein by ion implantation. And, an amorphous silicon film may be formed and subjected to the heat treatment to be polycrystallized.

Then, a photoresist film PR3 is formed over the n⁻-type semiconductor region 7a using the photolithography method. For example, the planar shape (pattern) of the photoresist film PR3 corresponds to that of the opening OA of the above photoresist film PR2.

Figure 27:
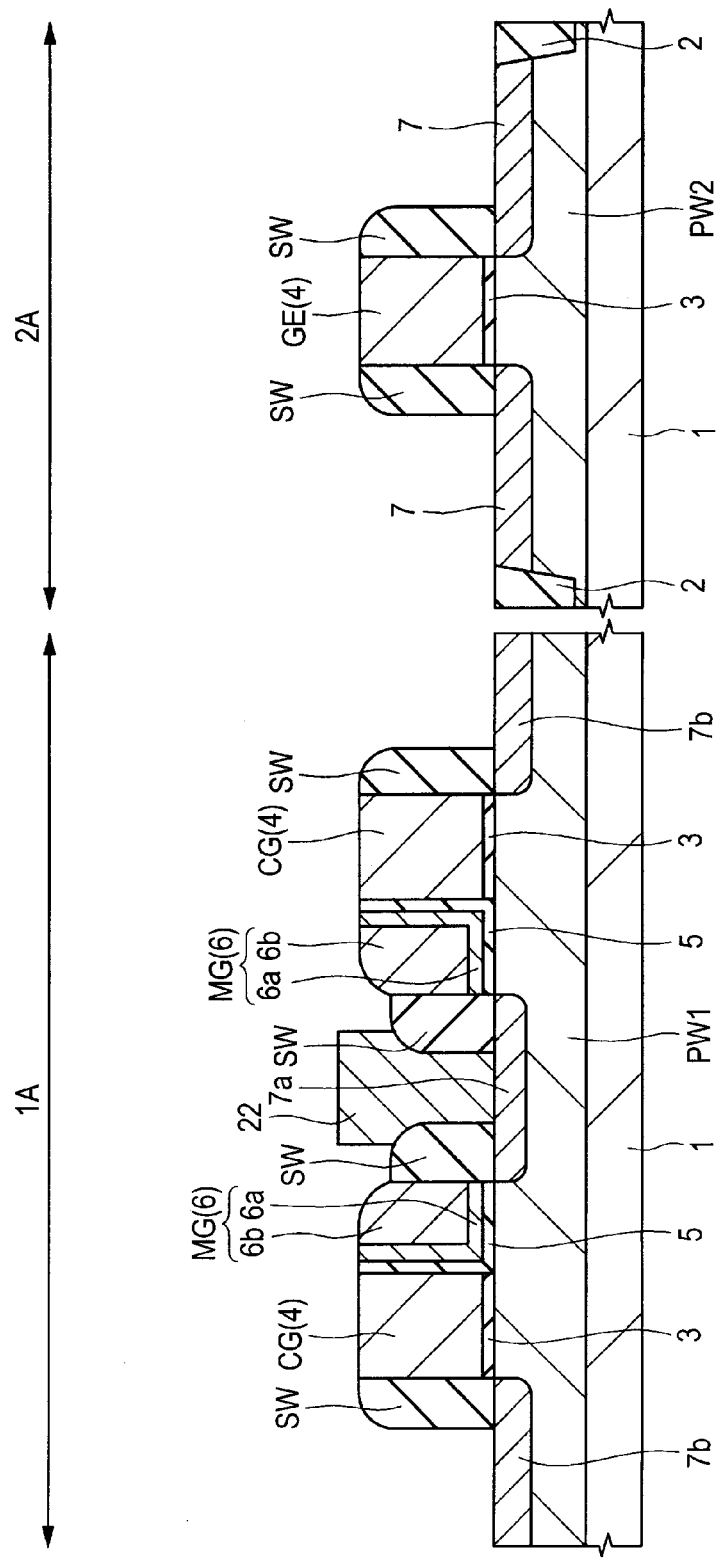
FIG. 27 is a cross-sectional view showing a main part of another manufacturing step of the semiconductor device in the fifth embodiment, following the step shown in FIG. 26.

Then, as shown in FIG. 27, the polycrystal silicon film 22 is etched using the photoresist film PR3 as a mask. Thereafter, the photoresist film PR3 is removed by ashing or the like to form the polycrystal silicon film 22 containing n-type impurities over the type semiconductor region 7a.

Figure 28:
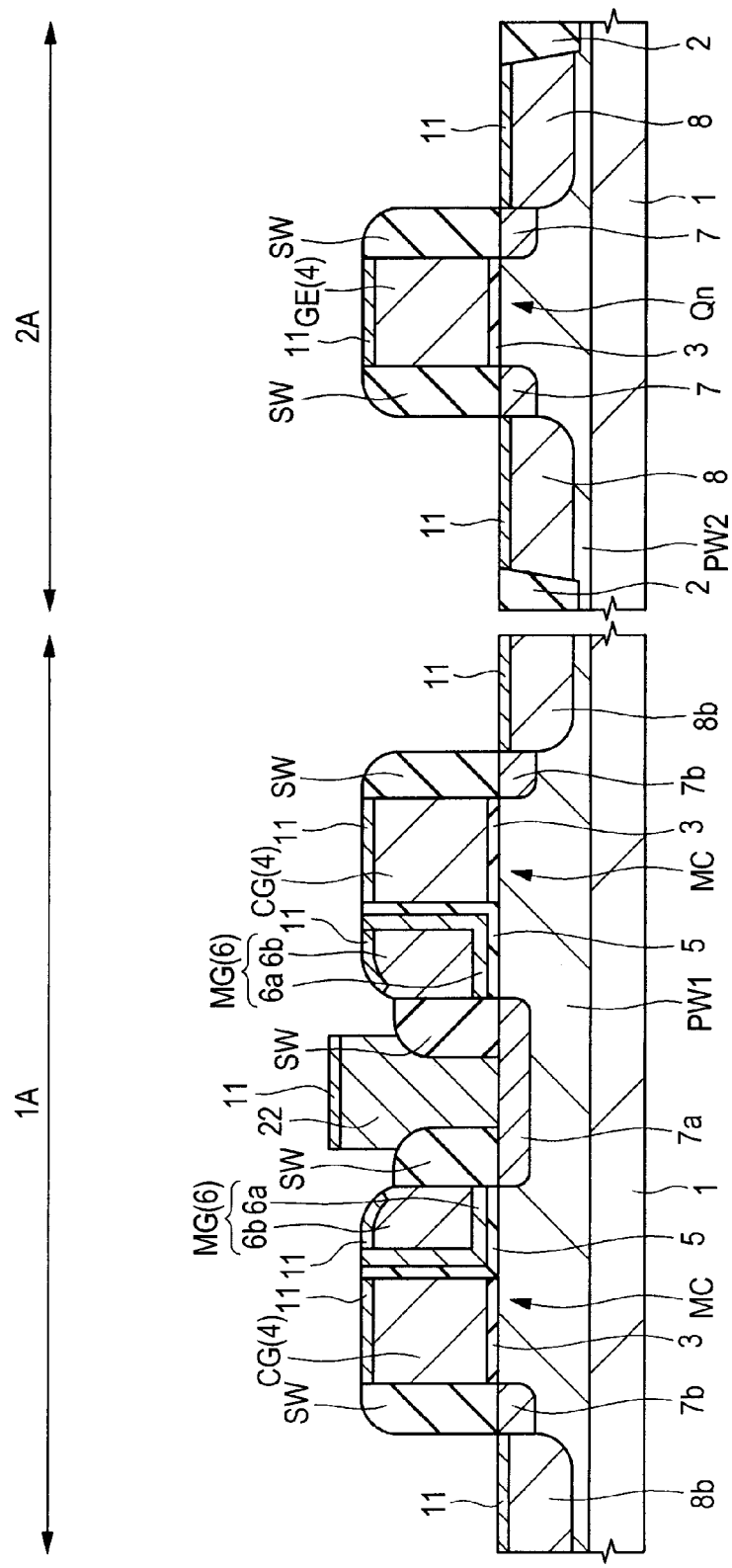
FIG. 28 is a cross-sectional view showing a main part of another manufacturing step of the semiconductor device in the fifth embodiment, following the step shown in FIG. 27.

If necessary, the main surface of the semiconductor substrate 1 is cleaned, for example, by wet etching using a diluted hydrofluoric acid. As shown in FIG. 28, the metal silicide layer 11 is formed over each of the control gate electrode. CG, the memory gate electrode MG, the polycrystal silicon film 22, and the n⁺-type semiconductor region 8b by a salicide technique. The metal silicide layer 11 is formed over each of the gate electrode GE and the n⁺-type semiconductor region 8. The metal silicide layer 11 can be formed in the same way as the first embodiment.

Thereafter, as shown in FIG. 29, an insulating film 12 is formed over the entire main surface of the semiconductor substrate 1. After planarizing the upper surface of the film 12 if necessary, plugs PG are formed. Then, an insulating film 14 is formed to form wirings M1 in the insulating film 14. Further, second or later layer wirings (not shown) are formed by a dual damascene method or the like. The insulating film 12, the plug PG, the wiring M1, and the second or later wirings can be formed in the same way as the first embodiment.

In this way, since the memory gate electrode MG in this embodiment is formed of the lamination comprised of the non-doped silicon film 6a and the doped silicon film 6b containing p-type impurities in the same way as the first embodiment, the data holding characteristics of the nonvolatile memory can be improved, like the first embodiment. The upper layer part of the memory gate electrode MG is formed of the doped silicon film 6b containing p-type impurities in the same manner as the first embodiment, which can reduce the resistance of the memory gate electrode MG to improve the operating speed of the nonvolatile memory.

Like the first embodiment, the source region (MS) of the memory transistor is comprised of the n⁻-type semiconductor region 7a, and the n-type impurities are introduced into the memory gate electrode MG (doped silicon film 6b containing p-type impurities), which can avoid an increase in resistance of the memory gate electrode MG.

The formation of the polycrystal silicon film 22 containing n-type impurities over the type semiconductor region 7a of the memory transistor can reduce the resistance of the source region (MS, and n⁻-type semiconductor region 7a). The n⁻-type semiconductor region 7a and the polycrystal silicon film 22 containing n-type impurities may be regarded as the source region (MS).

The formation of the metal silicide layer 11 over the polycrystal silicon film 22 can reduce the resistance of the source region MS (polycrystal silicon film 22 and the n⁻-type semiconductor region 7a).

The source region MS (polycrystal silicon film 22 and n⁻-type semiconductor region 7a) is formed in the form of long wiring (wiring for connecting source regions of a plurality of memory cells arranged in parallel in the direction of extension of the memory gate electrode MG, or source line). The wiring itself can reduce its resistance to improve the operating speed of the entire nonvolatile memory.

The formation of the polycrystal silicon film 22 over the metal silicide layer 11 can reduce the leak current. That is, when the metal silicide layer 11 is formed over the n⁻-type semiconductor region 7a (see FIG. 15), the thus-formed type semiconductor region 7a becomes shallow. Alternatively, when the metal silicide layer 11 is formed thickly, the leak current will be possibly generated from the semiconductor substrate (p-type well PW1) 1 via the metal silicide layer 11. In contrast, according to this embodiment, the metal silicide layer 11 is formed over the polycrystal silicon film 22, which can avoid the above leak current.

The structure and manufacturing method of the polycrystal silicon film 22 and the metal silicide layer 11 in this embodiment can be apparently applied not only to the semiconductor device of the first embodiment, but also to the semiconductor devices of the second to fourth embodiments.

Sixth Embodiment

In the above first to fifth embodiments, p-type impurities contained in the doped silicon film 6b include, for example, boron (B), indium (In), and the like. Each of the ion species has the following effect.

The boron has a small atomic weight, and thus tends to be easily implanted and activated. The use of the indium facilitates the control of the implantation region when ions of the indium are implanted because of its large atomic weight.

The invention made by the inventors has been specifically described based on the disclosed embodiments. It is apparent that the invention is not limited to those embodiments, and various modifications can be made to the embodiments without departing from the scope of the invention.

The invention is effectively applied to the semiconductor devices and the manufacturing methods thereof.

What is claimed is:

1. A semiconductor device, comprising:
    a semiconductor substrate;
    a first gate electrode disposed over the semiconductor substrate;
    a second gate electrode disposed over the semiconductor substrate so as to be adjacent to the first gate electrode;
    a first insulating film formed between the first gate electrode and the semiconductor substrate; and
    a second insulating film formed between the second gate electrode and the semiconductor substrate, and between the first gate electrode and the second gate electrode, said second insulating film including therein a charge storing portion,
    wherein the second gate electrode includes:
    a first silicon region positioned over the second insulating film; and
    a second silicon region positioned over the first silicon region,
    wherein the second silicon region contains p-type impurities,
    wherein a concentration of p-type impurities of the first silicon region is lower than that of the p-type impurities of the second silicon region,
    wherein the second insulating film and the first silicon region of the second gate electrode intervene in between the semiconductor substrate and the second silicon region of the second gate electrode, and
    wherein the second insulating film and the first silicon region of the second gate electrode intervene in between the first gate electrode and the second silicon region of the second gate electrode.

2. The semiconductor device according to claim 1, wherein the first silicon region is a p-type impurity region having a concentration of the p-type impurities lower than that of the p-type impurities of the second silicon region.

3. The semiconductor device according to claim 1, further comprising:
    a drain region disposed in the semiconductor substrate on the first gate electrode side, said drain region including a high concentration impurity diffusion layer and a first low concentration impurity diffusion layer; and
    a source region disposed in the semiconductor substrate on the second gate electrode side, said source region including a second low concentration impurity diffusion layer.

4. The semiconductor device according to claim 3, wherein the second gate electrode, the drain region and the source region contain n-type impurities.

5. The semiconductor device according to claim 3, further including a silicon film disposed over the source region and containing n-type impurities.

6. The semiconductor device according to claim 5, further including a metal silicide film disposed over the silicon film containing the n-type impurities.

7. The semiconductor device according to claim 1, wherein the p-type impurities contain boron (B) or indium (In).

8. A semiconductor device, comprising:
    a semiconductor substrate;
    a first gate electrode disposed over the semiconductor substrate;
    a second gate electrode disposed over the semiconductor substrate so as to be adjacent to the first gate electrode;
    a first insulating film formed between the first gate electrode and the semiconductor substrate; and
    a second insulating film formed between the second gate electrode and the semiconductor substrate, and between the first gate electrode and the second gate electrode, said second insulating film including therein a charge storing portion,
    wherein the second gate electrode includes:
    a first silicon region positioned over the second insulating film; and
    a second silicon region positioned over the first silicon region,
    wherein the second silicon region contains p-type impurities,
    wherein a concentration of p-type impurities of the first silicon region is lower than that of the p-type impurities of the second silicon region, and
    wherein the first silicon region is an n-type impurity region having a concentration of n-type impurities lower than that of the p-type impurities of the second silicon region.

9. The semiconductor device according to claim 8, further comprising:
    a drain region disposed in the semiconductor substrate on the first gate electrode side, said drain region including a high concentration impurity diffusion layer and a first low concentration impurity diffusion layer; and
    a source region disposed in the semiconductor substrate on the second gate electrode side, said source region including a second low concentration impurity diffusion layer.

10. The semiconductor device according to claim 9, wherein the second gate electrode, the drain region and the source region contain n-type impurities.

11. The semiconductor device according to claim 9, further including a silicon film disposed over the source region and containing n-type impurities.

12. The semiconductor device according to claim 11, further including a metal silicide film disposed over the silicon film containing the n-type impurities.

13. The semiconductor device according to claim 8, wherein the p-type impurities contain boron (B) or indium (In).

14. A semiconductor device, comprising:
a semiconductor substrate;
a first gate electrode disposed over the semiconductor substrate;
a second gate electrode disposed over the semiconductor substrate so as to be adjacent to the first gate electrode;
a first insulating film formed between the first gate electrode and the semiconductor substrate; and
a second insulating film formed between the second gate electrode and the semiconductor substrate, and between the first gate electrode and the second gate electrode, said second insulating film including therein a charge storing portion,
wherein the second gate electrode includes:
a first silicon region positioned over the second insulating film; and
a second silicon region positioned over the first silicon region,
wherein the second silicon region contains p-type impurities,
wherein a concentration of p-type impurities of the first silicon region is lower than that of the p-type impurities of the second silicon region, and
wherein the first silicon region is a region not containing any added impurities.

15. The semiconductor device according to claim 14, further comprising:
a drain region disposed in the semiconductor substrate on the first gate electrode side, said drain region including a high concentration impurity diffusion layer and a first low concentration impurity diffusion layer; and
a source region disposed in the semiconductor substrate on the second gate electrode side, said source region including a second low concentration impurity diffusion layer.

16. The semiconductor device according to claim 15, wherein the second gate electrode, the drain region and the source region contain n-type impurities.

17. The semiconductor device according to claim 15, further including a silicon film disposed over the source region and containing n-type impurities.

18. The semiconductor device according to claim 17, further including a metal silicide film disposed over the silicon film containing the n-type impurities.

19. The semiconductor device according to claim 14, wherein the p-type impurities contain boron (B) or indium (In).

* * * * *